United States Patent [19]

Penfold et al.

[11] Patent Number: 6,008,641
[45] Date of Patent: Dec. 28, 1999

[54] METHOD USING CORRECTIVE FACTORS FOR ALIGNING A MAGNETIC GRADIOMETER

[75] Inventors: Barry Penfold, Burtonsville; Stephen W. Frommer, Silver Spring, both of Md.

[73] Assignee: The United States of America as represented by the Secretary of the Navy, Washington, D.C.

[21] Appl. No.: 08/956,148

[22] Filed: Oct. 22, 1997

[51] Int. Cl.$^6$ ............ G01R 33/022; G01R 33/02; G01V 3/00

[52] U.S. Cl. ............ 324/245; 324/225; 324/247; 324/345; 702/104

[58] Field of Search ............ 324/244–247, 324/202, 225, 345, 346; 33/356, 361, 363 R; 702/104, 105, 92, 93

[56] References Cited

U.S. PATENT DOCUMENTS

| | | | |
|---|---|---|---|
| 2,996,663 | 8/1961 | Ferguson | 324/245 |
| 3,487,459 | 12/1969 | Schonstedt | 324/245 |
| 3,488,579 | 1/1970 | Schonstedt | 324/245 |
| 3,703,682 | 11/1972 | Wickman et al. | 324/245 |
| 3,757,209 | 9/1973 | Schonstedt | 324/245 |
| 3,962,628 | 6/1976 | Rein | 324/248 |
| 3,982,179 | 9/1976 | Forster | 324/245 |
| 4,386,318 | 5/1983 | Burbank et al. | 324/244 |

(List continued on next page.)

OTHER PUBLICATIONS

Penfold, Barry & Frommer, Stephen W., Triaxial Gradiometer, NSWCCARDIV–TR–96/011, Research and Development Report, Apr. 4, 1996, Survivability, Structures and Materials Directorate, NSWCCD, West Bethesda, MD (U.S. Navy).

DOD Printing Requisition/Order for NSWCCARDIV–TR–96/011, DD Form 282 (Navy), Req. No. N00167–97–PT–TW–009, date of request Nov. 15, 1996.

Beyer, William H., Ph.D., "Standard Mathematical Tables", 27th Ed., CRC Press, Inc., Boca Raton, Florida, 1985, p. 209.

Carnahan, Brice et al., "Applied Numerical Methods," John Wiley & Sons, Inc., NY, 1969, Chapter 1, pp. 1–5.

Van Nostrand's Scientific Encyclopedia, 5th Ed., NY, 1976, p. 728.

*Primary Examiner*—Gerard Strecker
*Attorney, Agent, or Firm*—Howard Kaiser

[57] ABSTRACT

Inventive electrical-computational method and system for aligning a magnetic gradiometer, and for determining magnetic gradients using a magnetic gradiometer which is inventively aligned. For each correlation of a correction magnetometer's vector with a reference magnetometer's vector, three correction coefficients and an offset coefficient are evaluated, using a mathematical approximation technique (such as least-squares) upon voltage outputs for various relative orientations of magnetic fields in relation to a magnetic gradiometer. An inventive matrix formula is used for determining magnetic gradients. A correction magnetometer matrix (matrix of voltages generated by each correction vector of the correction magnetometer) is multiplied by a coefficient matrix (matrix of correction and offset coefficients). The correction vectors within the correction magnetometer matrix are thus aligned with the reference vectors within the reference magnetometer matrix (matrix of voltages generated by each reference vector of the reference magnetometer) whereby, for each magnetic gradient determination pursuant to a correlation of a reference vector with a correction vector, any deviation from zero represents the magnetic gradient for that correlation. Many inventive embodiments incorporate temperature compensation, whereby the inventive practitioner establishes variations of correction and offset coefficients in accordance with temperature. With the assistance of computational electronics, inventive gradiometer alignments can be accomplished considerably more speedily than can gradiometer alignments according to conventional mechanical methodologies.

18 Claims, 7 Drawing Sheets

U.S. PATENT DOCUMENTS

| | | | |
|---|---|---|---|
| 4,437,064 | 3/1984 | Overton, Jr. et al. | 324/346 |
| 4,591,786 | 5/1986 | Koo et al. | 324/244 |
| 4,731,582 | 3/1988 | Posseme et al. | 324/245 |
| 4,806,865 | 2/1989 | Oury | 324/301 |
| 4,913,152 | 4/1990 | Ko et al. | 128/653 R |
| 5,113,136 | 5/1992 | Hayashi et al. | 324/247 |
| 5,115,197 | 5/1992 | Brandolino et al. | 324/245 |
| 5,122,744 | 6/1992 | Koch | 324/248 |
| 5,134,369 | 7/1992 | Lo et al. | 324/245 |
| 5,151,649 | 9/1992 | Heroux | 324/127 |
| 5,287,295 | 2/1994 | Ives et al. | 364/571.01 |
| 5,307,072 | 4/1994 | Jones, Jr. | 342/147 |
| 5,642,045 | 6/1997 | Keefe et al. | 324/247 X |
| 5,654,635 | 8/1997 | Assous et al. | 324/245 X |

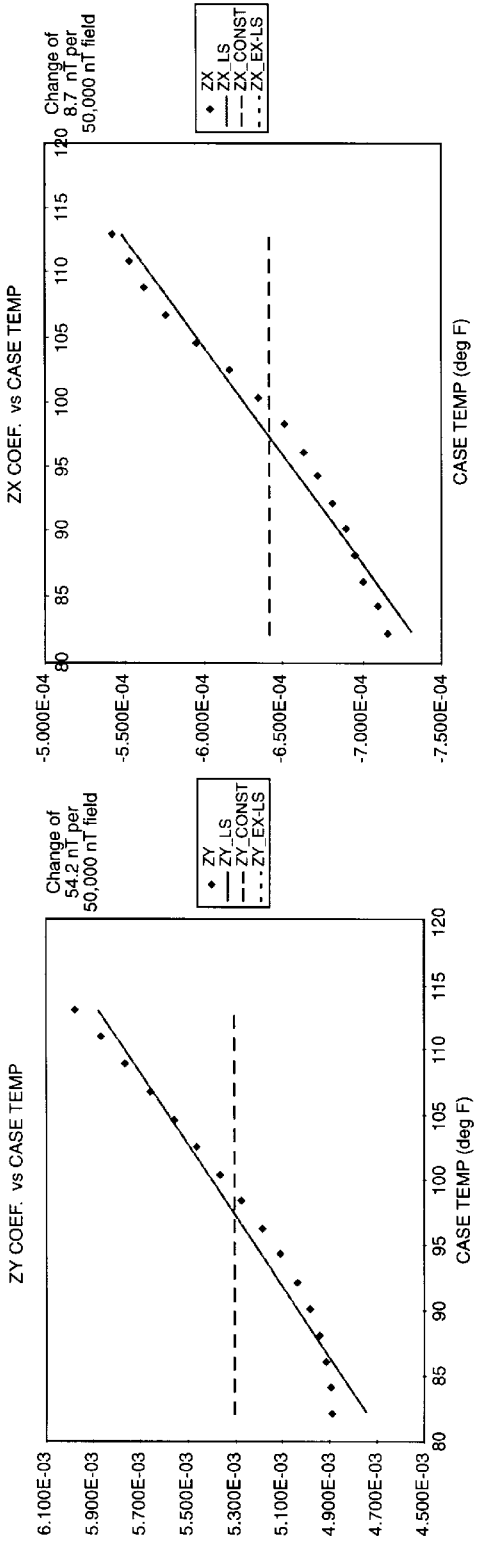
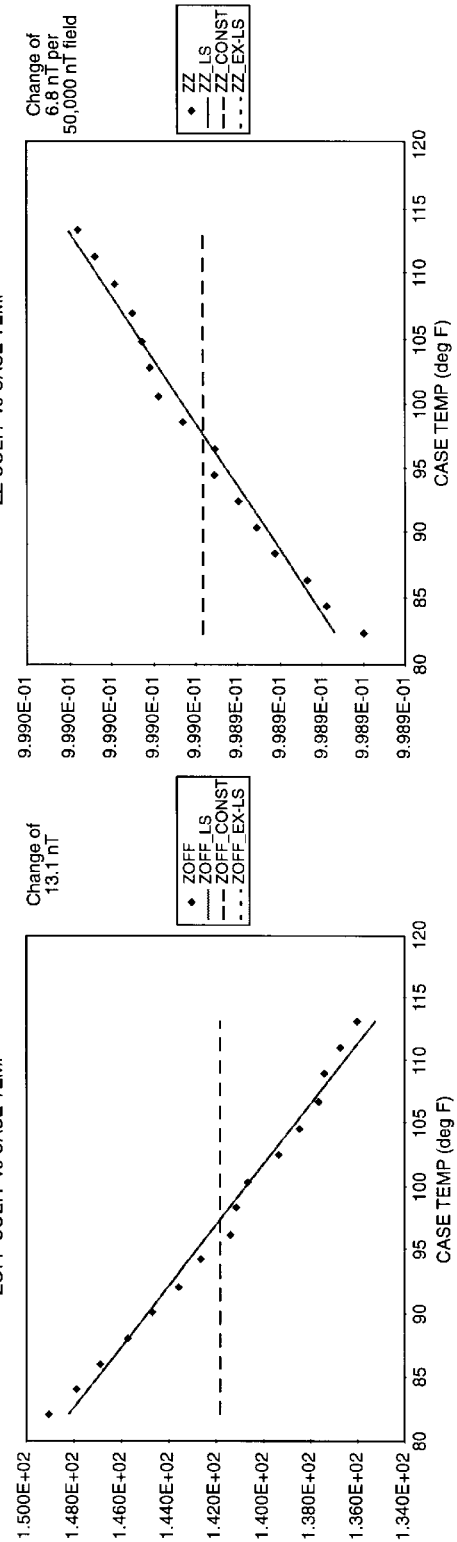
FIG. 6a — ZX COEF. vs CASE TEMP
FIG. 6b — ZY COEF. vs CASE TEMP
FIG. 6c — ZZ COEF. vs CASE TEMP
FIG. 6d — ZOFF COEF. vs CASE TEMP NOTE:
X_GRAD-QUAD: THE ALIGNMENT WHEN CORRECTION COEFFICIENTS (CCS) ARE FIT TO A QUADRATIC EQUATION
X_GRAD: THE ALIGNMENT WHEN CCS ARE FIT TO A LOOK-UP TABLE.
X_GRAD-CONS: THE ALIGNMENT WHEN CCS ARE JUST A CONSTANT
X_GRAD-LS: THE ALIGNMENT WHEN THE CCS ARE FIT TO A STRAIGHT LINE (IN 50 μT FIELD)

NOTE:
Y_GRAD-QUAD: THE ALIGNMENT WHEN CORRECTION COEFFICIENTS (CCS) ARE FIT TO A QUADRATIC EQUATION
Y_GRAD: THE ALIGNMENT WHEN CCS ARE FIT TO A LOOK-UP TABLE.
Y_GRAD-CONS: THE ALIGNMENT WHEN CCS ARE JUST A CONSTANT
Y_GRAD-LS: THE ALIGNMENT WHEN THE CCS ARE FIT TO A STRAIGHT LINE (IN 50 μT FIELD)

FIG. 9b
FIG. 9d
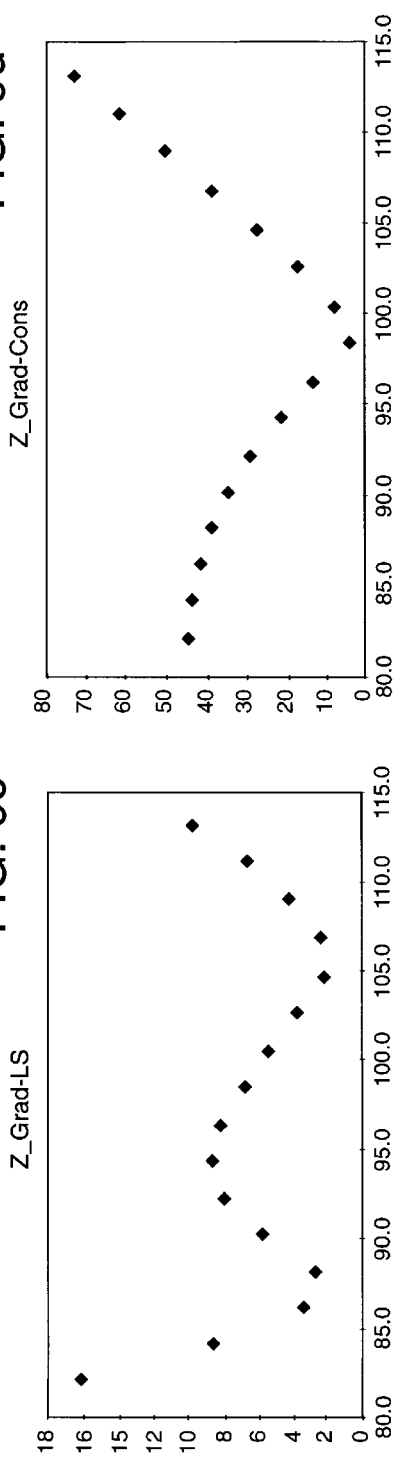
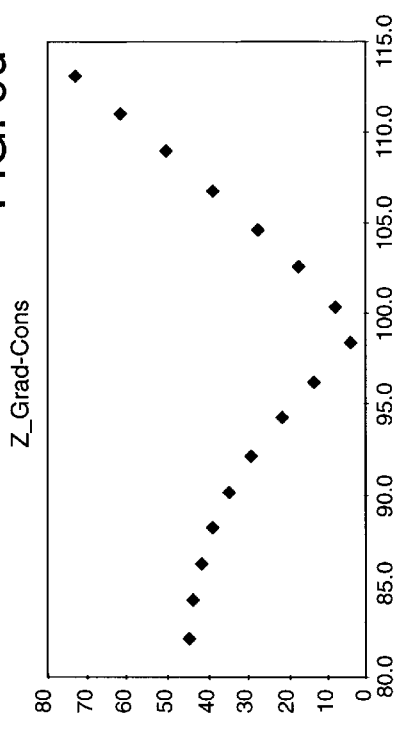
NOTE:
Z_GRAD-QUAD: THE ALIGNMENT WHEN CORRECTION COEFFICIENTS (CCS) ARE FIT TO A QUADRATIC EQUATION
Z_GRAD:      THE ALIGNMENT WHEN CCS ARE FIT TO A LOOK-UP TABLE.
Z_GRAD-CONS: THE ALIGNMENT WHEN CCS ARE JUST A CONSTANT
Z_GRAD-LS:   THE ALIGNMENT WHEN THE CCS ARE FIT TO A STRAIGHT LINE (IN 50 µT FIELD)

METHOD USING CORRECTIVE FACTORS FOR ALIGNING A MAGNETIC GRADIOMETER

CROSS-REFERENCE TO RELATED APPLICATION

This application is related to concurrently filed U.S. application of Stephen W. Frommer and Barry Penfold entitled "Method and System for Determining a Magnetic Gradient," application Ser. No. 08/955,618 incorporated herein by reference.

STATEMENT OF GOVERNMENT RIGHTS

The invention described herein may be manufactured and used by or for the Government of the United States of America for governmental purposes without the payment of any royalties thereon or therefor.

BACKGROUND OF THE INVENTION

The present invention relates to methods and systems for setting, adjusting, offsetting, compensating or calibrating in association with instruments which measure physical phenomena, more particularly to methods and systems for aligning magnetic gradiometers.

Magnetic gradiometers are sensors which measure magnetic gradients. A magnetic gradient is the slope of a magnetic field. Gradiometers are used in magnetic research and are also popular for sweeping areas to detect ferrous materials.

A gradiometer comprises two magnetometers which, typically, are located at or near opposite ends of the gradiometer. Each magnetometer includes at least one magnetometer vector (vectorial axis). In order to function properly, the two opposite magnetometers must be "aligned" with each other.

To elaborate, gradiometer alignment typically entails the collinear or nearly (but parallelly) collinear alignment, along or with respect to a single axis, of one or more pairs of vectors corresponding to opposite magnetometers. When at least one magnetometer includes a plurality of vectors, gradiometer alignment can also entail achievement of a desired vector orientation (e.g., orthogonality) with respect to the collinearly (or parallelly) aligned vectors.

For instance, take the situation wherein a gradiometer has two single-vector magnetometers which are nearly collinearly aligned (i.e., approximately along a single axis). The gradient (slope) is the difference between the two vector points. Theoretically, the true gradient would be the difference between the two vector points as the distance therebetween approaches zero. Realistically, a gradiometer cannot be made with this distance equal to zero, so this distance must be specified, e.g., as equal to one foot. Thus, for example, if the distance between the two vector points is equal to 1 foot (ft), the first vector measures a magnetic field of 50,000 nanoTesla (nT) and the second vector measures a magnetic field of 50,109 nT, then the gradient would be −109 nT/ft (or +109 nT/ft, depending on measurement convention).

Gradiometer alignment is critical in many applications. Take, for instance, the situation wherein a gradiometer has two single-vector magnetometers which are not collinearly aligned. The second vector is tilted, say, 0.1° with respect to the first vector, and earth's magnetic field is perpendicular to the first vector at 50,000 nT. The first vector will measure 0 nT, but the second vector will measure 50,000(sin 0.1)=87 nT; hence, the second vector will be 87 nT "off" (in error). Therefore, the gradient would be −87 nT/ft (or +87 nT/ft, depending on measurement convention) instead of the desired 0 nT/ft. This is poor alignment because, in the context of detecting ferrous materials, many magnetic signatures are <20 nT/ft.

A gradiometer which is perfectly aligned can be "swinging" (i.e., moving freely at varying orientations) in earth's non-gradient field, and still maintain a reading of 0 nT/ft. However, if the gradiometer alignment is off by 0.1°, any motion of the gradiometer in earth's field will show a false gradient, thereby rendering difficult the differentiation between a ferrous material and a false gradient.

A typical test of gradiometer alignment involves rotation of the gradiometer spherically in the earth's 50,000 nT gradient-free field. The peak-to-peak gradient error will then reveal the misalignment angle.

Conventional approaches to aligning a gradiometer are mechanical in nature. Several gradiometers have been developed which are mechanically aligned to a precision of 0.01°. A gradiometer aligned to 0.01° will produce an error of 8 nT/ft in a 50,000 nT field. This is the best alignment which current fluxgate magnetometers can achieve over a 40° F. temperature range.

Mechanical alignment of a gradiometer axis is a long and tedious process. It is an arduous, time-consuming struggle to mechanically align a gradiometer to a reasonable degree of precision. Furthermore, temperature stability has to be taken into consideration for the mechanical mounting scheme as well as for the electronics. Moreover, the mechanical alignment typically degrades over time, whereupon the gradiometer must be realigned, usually with greater difficulty than for the initial alignment. In addition, commercially available gradiometers are generally expensive, with single axis gradiometers and triaxial gradiometers running about the same price; achievement of the requisite precision for a trixial gradiometer could obviate the need to purchase three single axis gradiometers in its stead.

SUMMARY OF THE INVENTION

In view of the foregoing, it is an object of the present invention to provide method and system for magnetic gradiometer alignment which can achieve a greater degree of alignment precision than can conventional methods and apparatuses.

It is a further object of this invention to provide such method and system which can align faster than can conventional methods and systems.

Another object of the present invention is to provide such method and system which, unlike conventional methods and systems, can compensate for change in temperature.

Another object of this invention is to provide such method and system which are more economical than are conventional methods and systems.

One or more further objects of this invention are to achieve any of the foregoing objects so as to provide improved method and system for determining a magnetic gradient.

In accordance with the present invention, a magnetic gradiometer having two magnetometers is aligned.

One of the magnetometers is designated a "correction" magnetometer which has at least three "correction" vectors j_cor. Each correction vector j_cor is deemed herein to "correspond," in a mathematical sense, to one of the X, Y and Z axes, respectively, whereby the X, Y and Z axes are theoretically considered to be orthogonal. The symbol "j" denotes a positive integer between 1 and m inclusive, wherein all said correction vectors correspond serially to all positive integers between 1 and m inclusive.

For most inventive embodiments, it is preferable that the correction magnetometer have exactly three correction vectors, viz., "x_cor," "y_cor" and "z_cor"; again, for mathematical convenience, these three correction vectors are deemed herein to "correspond" to the "X axis," "Y axis" and "Z axis," respectively, whereby the X, Y and Z axes are theoretically orthogonal.

For some inventive embodiments, however, it may be advantageous to implement four or more correction vectors j_cor. For instance, in space applications, wherein equipment is not readily accessible, the present invention can be propitiously practiced utilizing at least one "extra" correction vector beyond three, thereby affording redundancy in the event of equipment failure.

According to the terminology herein, the inventive notion of "correspondence" of an axial vector with one of the X, Y or Z axes is intended to suggest inventive mathematical correspondence rather than actual physical correspondence. A magnetometer vector is referred to herein as an "axial" vector so as to impart this notion of inventive mathematical correspondence.

In practicing inventive embodiments wherein there are exactly three correction vectors (i.e., exactly three correction vectors are made use of), it is preferable that the three correction vectors actually be orthogonal, or approximately orthogonal, or nearly orthogonal, with respect to each other. However, it is emphasized that, in inventive practice of embodiments wherein there are exactly three correction vectors, these three correction vectors need not actually be orthogonal or approximately or nearly so.

In general inventive practice, for any number of correction vectors greater than or equal to three, the minimum requirement regarding the relative dispositions of the correction vectors is described as follows: (i) There must be at least two non-colinear, non-parallel correction vectors; and, (ii) When the practitioner selects two non-colinear, non-parallel correction vectors and envisions the parallel planes which pass through these correction vectors (or the single plane if the two correction vectors are coplanar), at least one of the remaining correction vectors must intersect these parallel planes (or this single plane).

The other magnetometer is designated a "reference" magnetometer which has at least one reference vector, viz., "i_ref." Each reference vector i_ref "corresponds" to one of the X, Y and Z axes. The symbol "i" denotes a positive integer between 1 and n inclusive, wherein all the reference vectors correspond serially to all positive integers between 1 and n inclusive.

For at least one reference vector i_ref, that reference vector is correlated with the correction vector which corresponds to the same axis ( X axis, Y axis or Z axis).

When practicing inventive embodiments wherein exactly three correction vectors are availed, this correlating includes evaluating the "correction coefficients" $A_i$, $B_i$ and $C_i$ and the "offset coefficient" $D_i$. This evaluating includes: (i) at least four times, relatively orienting a magnetic field with respect to the magnetic gradiometer; (ii) for each relative orientation, measuring a voltage output "$V_{x\_}^{cor}$" for x_cor, a voltage output "$V_{y\_}^{cor}$" for y_cor, a voltage output "$V_{z\_}^{cor}$" for z_cor, and a voltage output "$V_{i\_}^{ref\ for\ i}$"_ref; and approximating (e.g., using "least-squares") $A_i$, $B_i$, $C_i$ and $D_i$ in the equation $A_i(V_{x\_}^{cor})+B_i(V_{y\_}^{cor})+C_i(V_{z\_}^{cor})+D_i+V_{i\_}^{ref}=I_{grad}=0$, wherein "$I_{i\_}^{grad}$" is the magnetic gradient for this correlation.

Generalizing to inventive applications wherein three or more correction vectors j_cor are availed, this correlating includes evaluating the "correction coefficients" $K1_i$, $K2_i$, ... $Km_i$; and the "offset coefficient" $K(m+1)_i$. This evaluating includes: (i) at least four times, relatively orienting a magnetic field with respect to the magnetic gradiometer; (ii) for each relative orientation, measuring a voltage output "$V_{j\_}^{cor}$" for each said j_cor, and a voltage output "$V_{i\_}^{ref}$" for i_ref; and approximating (e.g., using "least-squares") $K1_i$, $K2_i$, $K3_i$ ... $K(m+1)_i$ in the equation $K1_i(V_{1\_}^{cor})+K2_i(V_{2\_}^{cor})+ ... +Km_i(V_{m\_}^{cor})+K(m+1)_i+V_{i\_}^{ref}=I_{i\_}grad=0$, wherein $I_{i\_}^{grad}$ is the magnetic gradient for the correlation, wherein i denotes a positive integer between 1 and n inclusive, wherein all the magnetic gradients correspond serially to all positive integers between 1 and n inclusive.

Each $I_{i\_}^{grad}$ is in correlative relationship with a reference vector i_ref. Each $I_{i\_}^{grad}$ corresponds to one of the X, Y and Z axes. The symbol "i" denotes a positive integer between 1 and n inclusive, wherein, in parallel fashion with the reference vectors i_ref, the magnetic gradients $I_{i\_}^{grad}$ correspond serially to all positive integers between 1 and n inclusive.

In inventive practice, when the reference magnetometer has one reference vector i_ref, that reference vector can be "x_ref," "y_ref" or "z_ref." When the reference magnetometer has three reference vectors, those reference vectors reference vector are x_ref, y_ref and z_ref. Reference vector x_ref corresponds to the X axis, reference vector y_ref corresponds to the Y axis, and reference vector z_ref corresponds to the Z axis. According to this invention, x_ref is correlated with x_cor; y_ref is correlated with y_cor; z_ref is correlated with z_cor.

It should be readily understood by the ordinarily skilled artisan that denotations such as "i_ref," "x_cor," "y_cor," "z_cor," etc. are intended herein to be of substantive rather than formal import; that is to say, it is the meaning behind the symbol, not the symbol itself, which is significant. This invention can equally be practiced by implementing alternative symbolization, so long as practice is in accordance with the teachings and principles of this invention.

The relative orienting of a magnetic field with respect to a magnetic gradiometer can be inventively achieved in either or both of two ways: The magnetic gradiometer is moved in a stationary uniform magnetic field, such as the earth's magnetic field; or, the magnetic field is directionally changed with respect to a stationary magnetic gradiometer, such as via a coil facility. In the lexicon of this disclosure, such movement of a sensor in a stationary uniform magnetic field is referred to as "rotation" of the sensor, and such change in direction of a magnetic field with respect to a stationary magnetic gradiometer is referred to as "rotation" of the magnetic field. For most inventive embodiments, such relative orienting should be performed at least six times, preferably wherein six times pertain to the positive and negative directions of each of the X, Y and Z axes.

Regardless of whether the sensor or the magnetic field is the rotating entity, the coefficients are numerically obtained by setting the magnetic gradient to zero. The U.S. Navy conducted tests wherein they physically rotated the triaxial gradiometer outside as well as rotated building fields, to determine alignment coefficients (i.e., correction coefficients and offset coefficient); they advantageously yielded results which allowed building coil gradients to be measured as well as the gradients of the locations where physical rotations were performed.

Testing relating to this invention is described in the following U.S. Navy report (an unclassified, limited distribution document), which is hereby incorporated herein by reference: Penfold, Barry and Frommer, Stephen W., Triaxial Gradiometer, "Research and Development Report" of the "Survivability, Structures and Materials Directorate" (Electromagnetic Fields Branch, Code 854), NSWCCARDIV-TR-96/011, dated Apr. 04, 1996 (but issued November 1996 or later), Naval Surface Warfare Center, Carderock Division, 9500 MacArthur Boulevard, West Bethesda, Md., 20817-5700.

Based on the inventive testing, some general guidelines became apparent as to the respective requirements and relative merits of physical rotation versus building coil rotation. To achieve high gradiometer alignment accuracy using physical rotation, the selected spot must have a low gradient (preferably, less than about 5 nT/ft). Likewise, to achieve high alignment accuracy using building-field rotation, the building coil field gradients, in the center of the coil system, must preferably be smaller than about 10 nT/ft in a 3 foot cube, i.e., <0.01% in terms of nonuniformity.

The U.S. Navy tests were conducted in a Helmholtz coil system in a building at a Naval Surface Warfare Center location in White Oak, Md. The U.S. Navy also attempted alignment tests in a magnetics facility at a Naval Surface Warfare Center location at Annapolis, Md.; these tests failed because this coil facility had high nonuniformity (1%) in a 3 foot cube.

Based on the U.S. Navy's testing, physically rotating the sensor (magnetic gradiometer) proved to be more accurate than rotating magnetic fields when the physical rotation was performed in a magnetic gradient-free spot; however, it is reasonable to expect that, for some inventive embodiments and applications, rotating magnetic fields may prove to be more accurate than physically rotating the sensor. It should generally prove difficult in inventive practice to control temperature using the physical rotation approach. Of course, a coil facility (such as a large Helmholtz coil facility) is not needed for performance of physical sensor rotation, which can take place outside ("in the field").

A coil facility of some type must be available for the magnetic field rotation alignment approach, which is generally faster than the physical sensor rotation approach and which more facilely admits of monitoring temperature effects, such monitoring being best performed at one temperature; physically rotating the sensor proved difficult when monitoring temperature effects. Furthermore, correction coefficients can be determined in a "magnetic" (non-uniform magnetic gradient) area by rotating magnetic fields; under such circumstances, the already-present gradient is just "absorbed" in the offset and is not manifested in the critical alignment coefficients.

Rotating magnetic fields around the stationary sensor proved to be accurate if the building coils had no gradients associated with them in the area of the sensor; however, so far this kind of "ideal" coil system is not known to exist. Nevertheless, the triaxial gradiometer alignments performed in a coil facility by the U.S. Navy for "Closed-Loop Degaussing" (CLDG) systems aboard U.S. Navy minesweepers was adequate for their requirements.

The repeated relative orientation according to most embodiments of this invention is appropriately styled herein a "spherical rotation" so as to connote an orientational process (preferably, to some degree or in some respect, systematic) of one entity with respect to the other in a three-dimensional Cartesian space, in a manner which is analogous to spherical rotation about a center. Hence, for some inventive embodiments, the magnetic gradiometer is rotated spherically in a uniform magnetic field; for other inventive embodiments, the magnetic gradiometer is fixed, and zero-gradient magnetic fields are rotated spherically about the magnetic gradiometer; for other inventive embodiments, both these modes of spherical rotation are effectuated.

A significant advantage of magnetic field rotation vis-a-vis' physical sensor rotation is that the former inventive rotational approach much better lends itself to inventive temperature compensation of the alignment coefficients. For purposes of inventively temperature-compensating the alignment coefficients, a preferred approach to the inventive practice of spherical rotation is practicing in a temperature-controllable environment (e.g., an oven) the mode of spherical rotation wherein zero-gradient magnetic fields are rotated spherically about the stationary magnetic gradiometer.

Inventive practice preferably includes temperature compensation for many embodiments. When temperature is inventively compensated for, at least one correlation of a reference vector with a correction vector includes: performing the evaluation of the correction coefficients $A_i$, $B_i$, $C_i$ and the offset coefficient $D_i$ at each of a plurality of temperatures; and, establishing a variation of $A_i$, $B_i$, $C_i$ and $D_i$ in accordance with temperature.

The inventive establishment of variation of the coefficients according to temperature can include a tabular manifestation (e.g., a "look-up" table) or a functional (e.g., including graphical) manifestation of such variation. A coefficient-versus-temperature variation can be expressed, via conventional mathematical curve-fitting methodology (e.g., including conventional mathematical approximation methodology such as "least-squares"), to a monomial or polynomial equation of first degree, second degree or higher, wherein y is a function of x (i.e., y=f(x)). For example, an equation which inventively expresses such coefficient-versus-temperature relationship can be a linear (first degree) equation of the form y=mx+b; or, the equation can be a quadratic (second degree) equation of the form $y=ax^2+bx+c$.

Also in accordance with the present invention, a magnetic gradient is determined using a magnetic gradiometer having two magnetometers which are inventively aligned. At least one correlation of a reference vector with a correction vector (wherein "alignment-purposed" voltage outputs are measured) is implemented for purposes of determining a magnetic gradient. For each such correlating which is inventively effected, the magnetic gradient $I_{grad}$ is solved for in the equation $A_i(V_{x\_}{}^{cor})+B_i(V_{y\_}{}^{cor})+C_i(V_{z\_}{}^{cor})+D_i+V_{i\_}{}^{ref}=I_{grad}$. This solving includes: measuring a "gradient-purposed" voltage output $V_{x\_}{}^{cor}$ for x_cor, a "gradient-purposed" voltage output $V_{y\_}{}^{cor}$ for y_cor, a "gradient-purposed" voltage output $V_{z\_}{}^{cor}$ for z_cor, and a "gradient-purposed" voltage output $V_{i\_}{}^{ref}$ for i_ref; and, applying the evaluated $A_i$, $B_i$, $C_i$ and $D_i$ and the measured $V_{x\_}{}^{cor}$, $V_{y\_}{}^{cor}$, $V_{z\_}{}^{cor}$ and $V_{i\_}{}^{ref}$.

Hence, in order to inventively determine a magnetic field gradient, each reference vector i_ref is correlated with the correction vector which corresponds to the same axis (X, Y or Z). Then, each $I_{i\_}{}^{grad}$ is solved for in the inventive matrix formula $$\begin{bmatrix} A_1 & B_1 & C_1 & D_1 \\ & \vdots & & \\ A_n & B_n & C_n & D_n \end{bmatrix} \begin{bmatrix} V_{x\_cor} \\ V_{y\_cor} \\ V_{z\_cor} \\ 1 \end{bmatrix} + \begin{bmatrix} V_{1\_ref} \\ \vdots \\ V_{n\_ref} \end{bmatrix} = \begin{bmatrix} I_{1\_grad} \\ \vdots \\ I_{n\_grad} \end{bmatrix}.$$

In other words, when the "correction magnetometer matrix" (matrix of voltages $V_{i\_}^{cor}$ generated by each correction vector of the correction magnetometer) is multiplied by the "coefficient" matrix (matrix of correction coefficients $A_i$, $B_i$ and $C_i$ and offset coefficient $D_i$), the correction vectors are aligned with the reference vectors set forth in the "reference magnetometer matrix" (matrix of voltages $V_{i\_}^{ref}$ generated by each reference vector of the reference magnetometer). Within the "gradient matrix" (to the right of the equal sign), for each magnetic gradient determination pursuant to a correlation of a reference vector with a correction vector, any deviation from zero represents the magnetic gradient for that correlation.

Applying the inventive matrix formula set forth immediately hereinabove to applications wherein the magnetic gradiometer is a "triaxial" gradiometer (i.e., has two triaxial magnetometers), it is seen that the magnetometer which is labeled a reference magnetometer has three reference vectors which may be labeled x_ref, y_ref and z_ref. Thus, the above inventive matrix formula can be rendered as follows for the triaxial situation, wherein inventive solving includes solving for $X_{grad}$, $Y_{grad}$ and $Z_{grad}$:

$$\begin{bmatrix} A_x & B_x & C_x & D_x \\ A_y & B_y & C_y & D_y \\ A_z & B_z & C_z & D_z \end{bmatrix} \begin{bmatrix} V_{x\_cor} \\ V_{y\_cor} \\ V_{z\_cor} \\ 1 \end{bmatrix} + \begin{bmatrix} V_{x\_ref} \\ V_{y\_ref} \\ V_{z\_ref} \end{bmatrix} = \begin{bmatrix} X_{grad} \\ Y_{grad} \\ Z_{grad} \end{bmatrix}.$$

The U.S. Navy placed two triaxial magnetometers on a titanium bar, thereby forming a "triaxial" gradiometer. Gradiometer alignments better than 8 nT/ft in a 50,000 nT field were produced when using the inventive matrix formula for a triaxial gradiometer as set forth hereinabove. It was found that, with temperature correction, the alignments could be maintained over a temperature range from 80° to 110°. Although in inventive principle greater temperature ranges can be used, these were not tested.

The inventive methodology for aligning a vectorial axis can be extremely quick (especially if computer-controlled or computer-automated) in comparison with conventional mechanical methodologies. Moreover, sensor characteristics of individual magnetometers are revealed in one quick alignment. It was found during U.S. Navy testing that rotating magnetic fields is an especially fast way to align an axis. A typical inventive automatic alignment using rotating fields took about 10 seconds. This represents a marked improvement over mechanical alignment schemes, which typically take several minutes to align.

In order to align a single axis, the present invention requires four magnetometer vectors, viz., three correction vectors and one reference vector. Mechanical alignment methodologies typically require two magnetometer vectors for aligning a single axis.

This invention represents an "telectrical-computational" methodology, as distinguished from a mechanical methodology, for aligning a magnetic gradiometer. According to this invention, voltage output measurements are necessarily obtained by electrical (e.g., electronic) sensing means. Computations (calculations, mathematical approximations, etc.) can be inventively performed: (i) entirely humanly (e.g., mentally or using "pen and paper"); or (ii) humanly using one or more auxilliary computational devices (e.g., microprocessor, electronic calculator or other electronic computer; abacus; slide rule; graph paper; etc.); or (iii) entirely or virtually entirely via electronic computer (i.e., computer-controlled or computer-automated).

Other objects, advantages and features of this invention will become apparent from the following detailed description of the invention when considered in conjunction with the accompanying drawings.

BRIEF DESCRIPTION OF THE DRAWINGS

In order that the present invention may be clearly understood, it will now be described, by way of example, with reference to the accompanying drawings, wherein like numbers indicate the same or similar components, and wherein:

FIG. 6a through FIG. 6c are each a graphical representation of a correction coefficient of the Z axis versus the temperature inside the gradiometer's case, and FIG. 6d is a graphical representation of the offset coefficient of the Z axis versus the temperature inside the gradiometer's case.

FIG. 9a through FIG. 9c are each a graphical representation of gradiometer alignment of the Z axis versus the temperature inside the gradiometer's case, when the correction coefficients of the Z axis are applied using temperature compensation; FIG. 9d is a graphical representation of gradiometer alignment of the Z axis versus the temperature inside the gradiometer's case, when the correction coefficients of the Z axis are applied in the absence of temperature compensation.

DETAILED DESCRIPTION OF THE INVENTION

Figure 1:
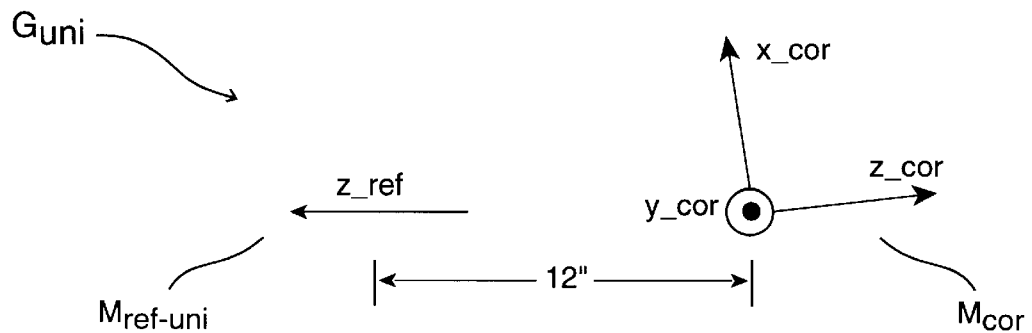
FIG. 1 is a vector diagram of a uniaxial magnetic gradiometer having an ideal triaxial magnetometer located at one end of the gradiometer.
Figure 2:
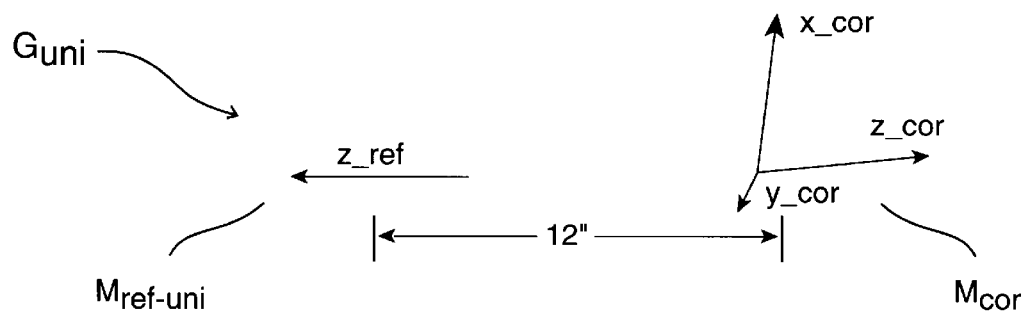
FIG. 2 is a vector diagram of a uniaxial magnetic gradiometer having a nonideal triaxial magnetometer located at one end of the gradiometer.

Referring now to FIG. 1 and FIG. 2, gradiometer $G_{uni}$ is a sensor which includes "reference" magnetometer $M_{ref\text{-}uni}$ and "correction" magnetometer $M_{cor}$. Uniaxial reference magnetometer $M_{ref\text{-}uni}$ has a single "axial" vector z_ref (representing "z reference"). Triaxial correction magnetometer $M_{cor}$ has three "axial" vectors, viz., x_cor, y_cor and z_cor (representing, respectively, "x corrected," "y corrected" and "z corrected"). Magnetometer $M_{ref\text{-}uni}$ and magnetometer $X_{cor}$ are placed one foot apart. As shown in FIG. 1 and FIG. 2, axial vector y_cor is coming out of the page. Gradiometer $G_{uni}$ is styled a "uniaxial" or "single axis" gradiometer (or sensor) because it has one reference magnetometer vector, viz., z_ref.

Let us propose to align, with respect to the Z axis, triaxial magnetometer $M_{cor}$ with uniaxial magnetometer $M_{ref}$; i.e., the objective is to align axial vector z_cor with axial vector z_ref so that gradiometer $G_{uni}$ shows a zero gradient when situated in a zero-gradient magnetic field. The conventional approach to achieving this objective involves mechanical alignment of axial vector z_cor with axial vector z_ref. The inventive approach to achieving this objective involves computational (e.g., electronic) alignment of axial vector z_cor with axial vector z_ref.

Represented in FIG. 1 is an ideal (albeit unrealistic) situation wherein all three axial vectors of magnetometer $M_{cor}$ are linear, are orthogonal with respect to each other, and have no offsets. Accordingly, in application to a theoretical ideal, the inventive alignment method is mathematically simplified. To translate x_cor, y_cor and z_cor about the origin, transformation of coordinates can be used. See, e.g., Beyer, William H., Ph.D., *Standard Mathematical Tables*, 27th Edition, CRC Press, Inc., Boca Raton, Fla., 1985, p. 209. Thus, z_cor can be rotated and aligned with z_ref. Let the new (translated) z_cor be called z_cor'. Then, z_cor' will be given as $$z\_cor' = a(x\_cor) + b(y\_cor) + c(z\_cor) \quad \text{(Eq. 1)}$$

where the constants a, b and c are referred to as "direction cosines." If the angle(s) between z_cor and z_ref is/are known, then the direction cosines can be determined.

Represented in FIG. 2 is a non-ideal but realistic situation wherein the three axial vectors of magnetometer $M_{cor}$ are not orthogonal with respect to each other, and there are offsets. The non-orthogonality of the magnetometer $M_{cor}$ triax is exaggerated for illustrative purposes in FIG. 2. Linearity of each of the axial vectors is still assumed; any non-linearity of an axial vector is deemed to be insignificant, i.e., small enough to ignore. Nevertheless, there are orthogonality errors and offsets with which to be concerned. Offsets must be taken into account because no two magnetometers are alike. Accordingly, practical considerations render the inventive alignment method more complicated.

The goal remains to align z_cor with z_ref. First, x_cor and y_cor must be "straightened out" so that all three axes of magnetometer $M_{cor}$ are orthogonal. Then, the $M_{cor}$ triax can be rotated and aligned with z_ref as stated in Equation 1. The final rotation formula is given as:

$$Z_{cor} = A_z(x\_cor) + B_z(y\_cor) + C_z(z\_cor) + D_z \quad \text{(Eq. 2)}$$

where $Z_{cor}$=triaxial correction magnetometer $M_{cor}$ having axial vector z_cor in alignment with axial vector z_ref $A_z$=correction coefficient, with respect to axial vector z_ref, for axial vector x_cor $B_z$=correction coefficient, with respect to axial vector z_ref, for axial vector y_cor $C_z$=correction coefficient, with respect to axial vector z_ref, for axial vector z_cor $D_z$=offset summation coefficient, with respect to axial vector z_ref, for axial vectors x_cor, y_cor and z_cor.

Still referring to FIG. 2 and using the information stated in Equation 2, assume that a gradient is present. More specifically, assume that a gradient is present with respect to the "Z axis." Then, the alignment equation for the Z axis is given by $$Z_{ref} + Z_{cor} = z\_ref + Z_{cor} = Z_{grad} \quad \text{(Eq. 3)}$$

where $Z_{ref}$=z_ref=uniaxial reference magnetometer $M_{ref\text{-}uni}$ having axial vector z_ref $Z_{cor}$=triaxial correction magnetometer $M_{cor}$ having axial vector z_cor in alignment with axial vector z-ref $Z_{grad}$=gradient for gradiometer G with respect to the Z axis as primary axis.

Substitution of Equation 2 into Equation 3 yields $$z\_ref + A_z(x\_cor) + B_z(y\_cor) + C_z(z\_cor) + D_z = Z_{grad}. \quad \text{(Eq. 4)}$$

Equation 4 is the alignment equation for the Z axis. The "Z axis" is referred to as the "primary" axis or the "gaussian" axis, since the axis of z_ref and the axis of z_cor are collinear; i.e., z_ref and z_cor are each being "corresponded" with respect to the Z axis. The X axis and the Y axis are referred to as the "parallel" axes when the Z axis is the "primary" (or "gaussian") axis. It should be noted that $Z_{ref}$ also has some voltage offset associated therewith; however, this offset component can be absorbed into $D_z$, which now becomes the offset summation coefficient, with respect to axial vector z_ref, for axial vectors z_ref, x_cor, y_cor and z_cor.

In Equation 4, there are four unknowns to be determined, viz., $A_z$, $B_z$, $C_z$ and $D_z$. Theoretically, if all angles and offsets are known, then $A_z$, $B_z$, $C_z$ and $D_z$ are rather easily determined using Equation 4. However, as a practical matter, the angles and offsets are generally not easily found. In accordance with this invention, a propitious approach to solving for $A_z$, $B_z$, $C_z$ and $D_z$ involves implementation of conventional numerical methodology for approximating the solution of a mathematical problem.

The unknowns $A_z$, $B_z$, $C_z$ and $D_z$ in Equation 4 can be inventively determined either (i) by rotating magnetic fields about a stationary gradiometer $G_{uni}$, or (ii) by rotating gradiometer $G_{uni}$ itself. Pursuant to the magnetic field rotation approach, zero-gradient magnetic fields are rotated spherically around stationary sensor $G_{uni}$. Pursuant to the sensor rotation approach, the gradiometer is spherically rotated in a zero-gradient location, such as in the earth's field. Either way, when solving for the unknowns $A_z$, $B_z$, $C_z$ and $D_z$ in Equation 4, the approximative computation is premised on the existence of a zero gradient for gradiometer $G_{uni}$ with respect to the "Z axis." More generally, inventive application of conventional approximation method presupposes that there are no gradients present with respect to a given axis.

Recalling Equation 3 and Equation 4, if no gradient is present, then $z\_ref + Z_{cor} = Z_{grad} = 0$, or $$z\_ref + A_z(x\_cor) + B_z(y\_cor) + C_z(z\_cor) + D_z = 0. \quad \text{(Eq. 5)}$$

Let us assume that we are inventively rotating zero-gradient magnetic fields around stationary sensor $G_{uni}$, in which case the value for $Z_{grad}$ will always be zero. Since there are four unknowns, namely, $A_z$, $B_z$, $C_z$ and $D_z$, the mathematical expediency suggests itself of performing measurements for four zero-gradient vector fields, so that there would be four equations and four unknowns. Once four magnetic fields have been applied and magnetic field vectors x_cor, y_cor, z_cor and z_ref have been measured for each magnetic field, the four equations (for the first magnetic field, the second magnetic field, the third magnetic field and the fourth magnetic field, respectively) are as follows:

$$(z\_ref)_1 + A_z(x\_cor)_1 + B_z(y\_cor)_1 + C_z(z\_cor)_1 + D_z = 0 \quad \text{(Eqs. 6)}$$

$$(z\_ref)_2 + A_z(x\_cor)_2 + B_z(y\_cor)_2 + C_z(z\_cor)_2 + D_z = 0$$

$$(z\_ref)_3 + A_z(x\_cor)_3 + B_z(y\_cor)_3 + C_z(z\_cor)_3 + D_z = 0$$

$$(z\_ref)_4 + A_z(x\_cor)_4 + B_z(y\_cor)_4 + C_z(z\_cor)_4 + D_z = 0$$

Unfortunately, the rendering in this manner of four equations having four unknowns generally does not yield accurate gradient computations. The unreliability of effectuating "four-by-four" simultaneous equations is probably attributable to the nonlinearities of each of the four vector magnetometers. In testing performed by the U.S. Navy, it was found that repeatable results were not produced by repeating the cycle of selecting four random vector fields, measuring the magnetic field vectors (e.g., x_cor, y_cor, z_cor and z_ref) for each field selected, and computing the correction coefficients (e.g., $A_z$, $B_z$, $C_z$) and offset coefficient (e.g., $D_z$) for each cycle.

Instead, it was found that the better inventive practice for most embodiments would be to measure as many field vectors as possible or practicable, and then perform a curve fitting technique such as "least-squares" fit. A well-known numerical method known as "least-squares" is frequently the technique of choice for scientists and engineers when the solution is over-determined. The "least-squares" method is a conventional mathematical technique wherein a curve is fitted close to some given points so as to minimize the sum of the squares of the deviations of the given points from the curve. In other words, values are fit with a polynomial so that the sum of the squares of the discrepancies between the values and the polynomial is a minimum. See, e.g., Carnahan, Brice et al., *Applied Numerical Methods*, John Wiley & Sons, Inc., New York, 1969, Chapter 1, esp., pages 3–4; *Van Nostrand's Scientific Encyclopedia*, infra, page 728.

Accordingly, for a sensor such as single axis gradiometer G shown in FIG. 2, n vector fields are applied to gradiometer G as stated below, wherein n is preferably $\geq 6$, and a least-squares fit is performed:

$$(z\_ref)_1 + A_z(x\_cor)_1 + B_z(y\_cor)_1 + C_z(z\_cor)_1 + D_z = 0 \quad \text{(Eqs. 7)}$$

$$(z\_ref)_2 + A_z(x\_cor)_2 + B_z(y\_cor)_2 + C_z(z\_cor)_2 + D_z = 0$$

$$(z\_ref)_3 + A_z(x\_cor)_3 + B_z(y\_cor)_3 + C_z(z\_cor)_3 + D_z = 0$$

$$(z\_ref)_4 + A_z(x\_cor)_4 + B_z(y\_cor)_4 + C_z(z\_cor)_4 + D_z = 0$$

$$\vdots$$

$$(z\_ref)_n + A_z(x\_cor)_n + B_z(y\_cor)_n + C_z(z\_cor)_n + D_z = 0$$

where for each application of a vector field $$(z\_ref)_i + A_z(x\_cor)_i + B_z(y\_cor)_i + C_z(z\_cor)_i + D_z = 0$$

and where (z_ref)$_i$=reference magnetometer $Z_{ref}$ measuring vector field i corresponding to a positive integer between 1 and n inclusive, wherein all the applied vector fields correspond serially to all positive integers between 1 and n inclusive.

(x_cor)$_i$=correction magnetometer x_cor measuring vector field i corresponding to a positive integer between 1 and n inclusive, wherein all the applied vector fields correspond serially to all positive integers between 1 and n inclusive.

(y_cor)$_i$=correction magnetometer y_cor measuring vector field i corresponding to a positive integer between 1 and n inclusive, wherein all the applied vector fields correspond serially to all positive integers between 1 and n inclusive.

(z_cor)$_i$=correction magnetometer z_cor measuring vector field i corresponding to a positive integer between 1 and n inclusive, wherein all the applied vector fields correspond serially to all positive integers between 1 and n inclusive.

After several experimental trials constructed by the U.S. Navy, the "rule of thumb" was determined that the minimum number of fields needed to produce adequate correction coefficients was six. These six fields corresponded to the ±X, ±Y and ±Z axes. A gradiometer alignment of <2.4 nT/ft was achieved by the U.S. Navy using a least-squares fit of six applied fields of roughly 54,000 nT.

It stands to reason that the accuracy of the alignment is commensurate with the number of vector fields applied; indeed, it is axiomatic in many disciplines that an increase in data tends to validate a measurement. Nevertheless, the inventive principle which favors more numerous applications of vector fields has its limitations in practice. There is a "law of diminishing returns" with regard to this inventive principle. As the number of vector fields applied increases, eventually the point is reached wherein the incremental increase in the number of applied vector fields is not justified by the incremental value associated therewith. For one thing, repeatedly applying vector fields entails an escalation of time and effort.

Furthermore, inventive testing by the U.S. Navy has not demonstrated that the application of a vector field in twenty-six orientations (i.e., by rotating the vector field about the sensor in 45° increments) is significantly more effective than such application in six orientations (i.e., by rotating the vector field about the sensor in 90° increments). Moreover, the application of the vector field in more than twenty-six orientations does not appreciably improve the result vis-a-vis' such application in twenty-six orientations.

As for the magnitude of the field vectors, the U.S. Navy kept the field vectors near 50,000 nT for two reasons. Firstly, 50,000 nT is a typical value for the earth's field, which is what the gradiometer will be sensing in the majority of applications. Secondly, 50,000 nT is large enough to show the nonlinearities of the magnetometers. An advantage of performing least-squares fits is that each applied field vector does not have to be exactly 50,000 nT. Typically, the U.S. Navy applied fields of 54,000±1,000 nT.

The U.S. Navy implemented relatively inexpensive gradiometers, each of which was housed in a rectangular case having approximate dimensions of 16 inches×4.75 inches×2 inches. The U.S. Navy situated magnetometers within a waterproof case for purposes of mounting aboard a ship. It should be noted that the inventive alignment method does not align the gradiometer axis to the exterior case. The alignment of the gradiometer axis to the case is no better than the alignment of the reference magnetometer vector to the case.

There are several advantages to the inventive scheme of using least-squares fitting in association with magnetic field rotation about a stationary sensor. The entire inventive gradiometer alignment system (rotating vector fields and taking data) can be computer-automated; of course, this is faster and easier than measuring and rotating fields by hand.

Moreover, for any reference axis, the close proximity of a permanent magnetic object (one that has little inducing field), thus producing a local gradient, will not affect the calculation of correction coefficients $A_i$, $B_i$ and $C_i$, wherein i designates the reference axis. It has been experimentally verified by the U.S. Navy that the local gradient will be "absorbed" into the offset coefficient $D_i$; alignment is unaffected, albeit that the local gradient raises offset $D_i$.

In addition, temperature can be controlled. In accordance with the present invention, alignment can be temperature-compensated. As elaborated upon hereinbelow, the U.S. Navy built a special non-magnetic oven for testing purposes, placing the oven in the center of a building's coil system. The temperature could be raised and lowered (manually or via computer) and held steady to within 0.2° F. It was found that the gradiometer tested was temperature-dependent in approximately linear fashion.

The U.S. Navy considered how the degree of eccentricity of a gradiometer's placement with respect to a building's coil system affects the accuracy of the gradiometer's alignment. Theoretically, coil gradients increase as the measurement point is moved from the center. However, the least squares method of determining correction coefficients, in absorbing the local (building coil) gradients, presupposes centricity of the sensor with respect to the coil system. Therefore, there is a theoretical error inherent in an inventive application wherein the gradiometer is not exactly centrally situated within a rotating building coil system. The U.S. Navy found that placement of the sensor one foot off-center could cause about a fivefold or tenfold misalignment (in building 203). Accordingly, inventive practitioners should strive to position the gradiometer within the coil system as centrally as possible.

Of course, the ideal building coil facility (e.g., perfect large cube) does not exist. The U.S. Navy's testing revealed building coil gradients on the order of 20 nT/ft, which probably suggests that that electrical/software alignment of the gradiometer in that particular building can be no better than 20 nT/ft. Nevertheless, the inventive field rotation approach may yield adequate results for many applications, and has its advantages.

For many applications, the inventive sensor rotation approach may prove to be a more dependable way to obtain correction coefficients. However, unlike magnetic field rotation, sensor rotation will not absorb local gradients into the calculation of correction coefficients. Finding a zero-gradient outside location may be problematical. Another problem associated with sensor rotation is the lack of temperature control. Mother Nature may not be cooperative insofar as maintaining constant the ambient temperature. Hence, unlike sensor rotation, field rotation permits temperature control as well as evaluation of how correction coefficients change in accordance with temperature change.

Perhaps the inventive alignment method is ideally effectuated by rotating a gradiometer (e.g., a "triaxial" gradiometer) in a temperature-controlled magnetic-gradient-free room. A programmable spherical turntable for holding the gradiometer could be devised, thereby automating the inventive method. The U.S. Navy did not test the invention in such a manner and under such conditions.

Figure 3:
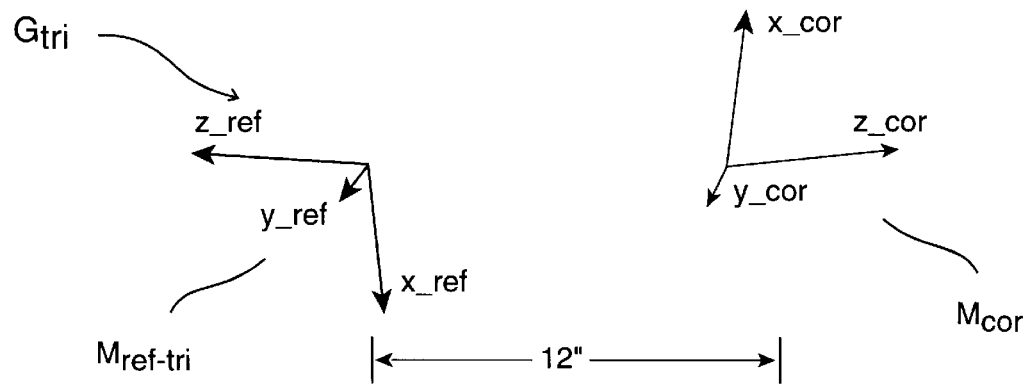
FIG. 3 is a vector diagram of a triaxial magnetic gradiometer having a nonideal triaxial magnetometer located at one end of the gradiometer.

With reference to FIG. 3, gradiometer $G_{tri}$ is a sensor which includes "reference" magnetometer $M_{ref\text{-}tri}$ and "correction" magnetometer $M_{cor}$. Triaxial magnetometer $M_{ref\text{-}tri}$ has a three axial vectors, viz., x_ref, y_ref and z_ref. Again, triaxial magnetometer $M_{cor}$ has three axial vectors, viz., x_cor, y_cor and z_cor. Magnetometer $M_{ref\text{-}tri}$ and magnetometer $M_{cor}$ are placed one foot apart. As shown in FIG. 3, axial vectors y_ref and y_cor are each coming out of the page. The non-orthogonality of the magnetometer $M_{cor}$ triax and the magnetometer $M_{ref\text{-}tri}$ triax is exaggerated for illustrative purposes in FIG. 3. Gradiometer $G_{tri}$ is styled a "triaxial" or "triple axis" gradiometer (or sensor) because it has three reference magnetometer vectors, viz., x_ref, y_ref and z_ref.

Let us now propose to align, with respect to the X, Y and Z axes, triaxial magnetometer $M_{cor}$ with triaxial magnetometer $M_{ref\text{-}tri}$; i.e., the objective is to align, so that gradiometer $G_{tri}$ shows a zero gradient when situated in a zero-gradient magnetic field: axial vector x_cor with axial vector x_ref; axial vector y_cor with axial vector y_ref; and, axial vector z_cor with axial vector z_ref.

Alignment of z_cor with z_ref is discussed hereinabove in connection with uniaxial gradiometer $G_{uni}$, which has only one reference vector magnetometer axis, viz., z_ref; hence, in the context of alignment of gradiometer $G_{uni}$, the Z axis is the primary (or gaussian) axis, and there is no parallel axis.

By contrast, triaxial gradiometer $G_{tri}$, shown in FIG. 3, has a reference magnetometer $M_{ref\text{-}tri}$ having three vector magnetometer axes, viz., x_ref, y_ref and z_ref. Here the goal is to align x_cor with x_ref, y_cor with y_ref, and z_cor with z_ref. Whether x_cor is being aligned with x_ref, y_cor is being aligned with y_ref, or z_cor is being aligned with z_ref, the Z axis is the primary (or gaussian) axis, and the X and Y axes are parallel axes.

As treated in turn hereinbelow, the alignment equation for each of axes X, Y and Z is an Equation 4 analogue. For each axial alignment, it is first conceived that the two magnetometer $M_{cor}$ axes corresponding to the parallel axes (X and Y) are "straightened out" so that all three magnetometer $M_{cor}$ axes are orthogonal; then, the $M_{cor}$ triax can be rotated and aligned with the magnetometer $M_{cor}$ axis corresponding to the primary axis (Z), similarly as stated in Equation 1.

X axis alignment

The final rotation formula is analogous to Equation 2:

$$X_{cor}=A_x(x\_cor)+B_x(y\_cor)+C_x(z\_cor)+D_x \qquad \text{(Eq. 8)}$$

where $X_{cor}$=triaxial correction magnetometer $M_{cor}$ having axial vector x_cor in alignment with axial vector x-ref $A_x$=correction coefficient, with respect to axial vector x_ref, for axial vector x_cor $B_x$=correction coefficient, with respect to axial vector x_ref, for axial vector y_cor $C_x$=correction coefficient, with respect to axial vector x_ref, for axial vector z_cor $D_x$=offset summation coefficient, with respect to axial vector x_ref, for axial vectors x_cor, y_cor and z_cor.

The alignment equation for the X axis is given by $$X_{ref} + X_{cor} = x\_ref + X_{cor} = X_{grad} \quad \text{(Eq. 9)}$$

where $X_{ref}$=x_ref=triaxial reference magnetometer $M_{ref\text{-}tri}$ having axial vector x_ref corresponding to reference axis $X_{cor}$=triaxial correction magnetometer $M_{cor}$ having axial vector x_cor in alignment with axial vector x-ref $X_{grad}$=gradient for gradiometer $G_{tri}$ with respect to the X axis as reference axis.

Substitution of Equation 8 into Equation 9 yields $$x\_ref + A_x(x\_cor) + B_x(y\_cor) + C_x(z\_cor) + D_x = X_{grad}. \quad \text{(Eq. 10)}$$

Equation 10 is the alignment equation for the X axis. It is noted that the offset associated with $X_{ref}$ is absorbed into $D_x$, which now becomes the offset summation coefficient, with respect to axial vector x_ref, for axial vectors x_ref, x_cor, y_cor and z_cor.

Y axis alignment

The final rotation formula is analogous to Equation 2:

$$Y_{cor} = A_y(x\_cor) + B_y(y\_cor) + C_y(z\_cor) + D_y \quad \text{(Eq. 11)}$$

where $Y_{cor}$=triaxial correction magnetometer $M_{cor}$ having axial vector y_cor in alignment with axial vector y-ref $A_y$=correction coefficient, with respect to axial vector y_ref, for axial vector x_cor $B_y$=correction coefficient, with respect to axial a vector y_ref, for axial vector y_cor $C_y$=correction coefficient, with respect to axial vector y_ref, for axial vector z_cor $D_y$=offset summation coefficient, with respect to axial vector y_ref, for axial vectors x_cor, y_cor and z_cor.

The alignment equation for the Y axis is given by $$Y_{ref} + Y_{cor} = y\_ref + Y_{cor} = Y_{grad} \quad \text{(Eq. 12)}$$

where $Y_{ref}$=y_ref=triaxial reference magnetometer $M_{ref\text{-}tri}$ having axial vector y_ref corresponding to reference axis $Y_{cor}$=triaxial correction magnetometer $M_{cor}$ having axial vector y_cor in alignment with axial vector y-ref $Y_{grad}$=gradient for gradiometer $G_{tri}$ with respect to the Y axis as primary axis.

Substitution of Equation 11 into Equation 12 yields $$y\_ref + A_y(x\_cor) + B_y(y\_cor) + C_y(z\_cor) + D_y = Y_{grad}. \quad \text{(Eq. 13)}$$

Equation 13 is the alignment equation for the Y axis. It is noted that the offset associated with $Y_{ref}$ is absorbed into $D_y$, which now becomes the offset summation coefficient, with respect to axial vector y_ref, for axial vectors y_ref, x_cor, y_cor and z_cor.

Z axis alignment

The final rotation formula is virtually identical to Equation 2:

$$Z_{cor} = A_z(x\_cor) + B_z(y\_cor) + C_z(z\_cor) + D_z \quad \text{(Eq. 14)}$$

where $Z_{cor}$=triaxial correction magnetometer $M_{cor}$ having axial vector z_cor in alignment with axial vector z-ref $A_z$=correction coefficient, with respect to axial vector z_ref, for axial vector x_cor $B_z$=correction coefficient, with respect to axial vector z_ref, for axial vector y_cor $C_z$=correction coefficient, with respect to axial vector z_ref, for axial vector z_cor $D_z$=offset summation coefficient, with respect to axial vector z_ref, for axial vectors x_cor, y_cor and z_cor.

The alignment equation for the Z axis, virtually identical to Equation 3, is given by $$Z_{ref} + Z_{cor} = z\_ref + Z_{cor} = Z_{grad} \quad \text{(Eq. 15)}$$

where $Z_{ref}$=z_ref=triaxial reference magnetometer $M_{ref\text{-}tri}$ having axial vector z_ref corresponding to reference axis $Z_{cor}$=triaxial correction magnetometer $M_{cor}$ having axial vector z_cor in alignment with axial vector z-ref $Z_{grad}$=gradient for gradiometer $G_{tri}$ with respect to the Z axis as primary axis.

Substitution of Equation 14 into Equation 15 yields $$z\_ref + A_z(x\_cor) + B_z(y\_cor) + C_z(z\_cor) + D_z = Z_{grad}. \quad \text{(Eq. 16)}$$

Equation 16, virtually identical to Equation 4, is the alignment equation for the Z axis. It is noted that the offset associated with $Z_{ref}$ is absorbed into $D_z$, which now becomes the offset summation coefficient, with respect to axial vector z_ref, for axial vectors z_ref, x_cor, y_cor and z_cor.

It is well understood by those skilled in the art that a magnetometer, like many electronic instruments, typically expresses an output in terms of a voltage. There is a functional relationship (typically, a proportionality) between the magnetic field (typically expressed in nanoTesla, abbreviated "nT") which a magnetometer senses and the voltage (typically expressed in volts, abbreviated "V") which the magnetometer actually "measures"; the voltage output is typically a scalar measurement indicative of the magnetic field. For example, magnetometers which the U.S. Navy used for testing were characterized by a scalar voltage output whereby the conversion formula was 1 V=10,000 nT. In inventive practice, the computational outcomes should be the same regardless of whether the voltage measurements are converted to nanoTesla measurements prior to, or subsequent to, performance of least-square approximations.

Therefore, in order to better connote that magnetometers typically manifest scalar output voltages, a change in nomenclature may be appropriate. It may thus be expedient to instead denote axial vectors x_ref, y_ref, z_ref, x_cor, y_cor and z_cor, respectively, as $V_{x\_}^{ref}$, $V_{y\_}^{ref}$, $V_{z\_}^{ref}$, $V_{x\_}^{cor}$, $V_{y\_}^{cor}$ and $V_{z\_}^{cor}$. In addition, each of Equations 10, 13 and 16 can be slightly reordered. Accordingly, Equations 10, 13 and 16 can be restated as Equations 17, 18 and 19, respectively, as follows:

$$A_x(V_{x\_}{}^{cor})+B_x(V_{y\_}{}^{cor})+C_x(V_{z\_}{}^{cor})+D_x+V_{x\_}{}^{ref}=X_{grad}, \quad \text{(Eq. 17)}$$

$$A_y(V_{x\_}{}^{cor})+B_y(V_{y\_}{}^{cor})+C_y(V_{z\_}{}^{cor})+D_y+V_{y\_}{}^{ref}=Y_{grad} \quad \text{(Eq. 18)}$$

and $$A_z(V_{x\_}{}^{cor})+B_z(V_{y\_}{}^{cor})+C_z(V_{z\_}{}^{cor})+D_z+V_{z\_}{}^{ref}=Z_{grad}, \quad \text{(Eq. 19)}$$

where $A_x$=X axis correction coefficient for x_cor magnetometer
$A_y$=Y axis correction coefficient for x_cor magnetometer
$A_z$=Z axis correction coefficient for x_cor magnetometer
$B_x$=X axis correction coefficient for y_cor magnetometer
$B_y$=Y axis correction coefficient for y_cor magnetometer
$B_z$=Z axis correction coefficient for y_cor magnetometer
$C_x$=X axis correction coefficient for z_cor magnetometer
$C_y$=Y axis correction coefficient for z_cor magnetometer
$C_z$=Z axis correction coefficient for z_cor magnetometer
$D_x$=X axis offset coefficient for all four apposite magnetometers (viz., x_cor, y_cor, z_cor and x_ref)
$D_y$=Y axis offset coefficient for all four apposite magnetometers (viz., x_cor, y_cor, z_cor and y_ref)
$D_z$=Z axis offset coefficient for all four apposite magnetometers (viz., x_cor, y_cor, z_cor and z_ref)
$V_{x\_}{}^{cor}$=x_cor=magnetic field (or magnetic field-equivalent, e.g., voltage) measured by the x_cor magnetometer
$V_{y\_}{}^{cor}$=y_cor=magnetic field (or magnetic field-equivalent, e.g., voltage) measured by the y_cor magnetometer
$V_{z\_}{}^{cor}$=z_cor=magnetic field (or magnetic field-equivalent, e.g., voltage) measured by the z_cor magnetometer
$V_{x\_}{}^{ref}$=x_ref=magnetic field (or magnetic field-equivalent, e.g., voltage) measured by the x_ref magnetometer
$V_{y\_}{}^{ref}$=y_ref=magnetic field (or magnetic field-equivalent, e.g., voltage) measured by the y_ref magnetometer
$V_{z\_}{}^{ref}$=z_ref=magnetic field (or magnetic field-equivalent, e.g., voltage) measured by the z_ref magnetometer
$X_{grad}$=calculated X gradient; this is set to zero (0) when computing the X axis coefficients using a mathematical approximation method such as the least-squares method.
$Y_{grad}$=calculated Y gradient; this is set to zero (0) when computing the Y axis coefficients using a mathematical approximation method such as the least-squares method.
$Z_{grad}$=calculated Z gradient; this is set to zero (0) when computing the Z axis coefficients using a mathematical approximation method such as the least-squares method.

Set forth above (Equations 17, 18 and 19) are the basic triaxial formulae for the present invention; that is, these formulae are applicable for inventive embodiments wherein the reference magnetometer is a "triax." When axis x_ref is the designated reference magnetometer, x_cor is aligned to x_ref by applying X axis coefficients to x_cor, y_cor and z_cor. Likewise, when axis y_ref is the designated reference magnetometer, y_cor is aligned to y_ref by applying Y axis coefficients to x_cor, y_cor and z_cor. Likewise, when axis z_ref is the designated reference magnetometer, z_cor is aligned to z_ref by applying Z axis coefficients to x_cor, y_cor and z_cor.

Equations 17, 18 and 19 can all be summarized in the following matrix formula:

$$\begin{bmatrix} A_x & B_x & C_x & D_x \\ A_y & B_y & C_y & D_y \\ A_z & B_z & C_z & D_z \end{bmatrix} \begin{bmatrix} V_{x\_cor} \\ V_{y\_cor} \\ V_{z\_cor} \\ 1 \end{bmatrix} + \begin{bmatrix} V_{x\_ref} \\ V_{y\_ref} \\ V_{z\_ref} \end{bmatrix} = \begin{bmatrix} X_{grad} \\ Y_{grad} \\ Z_{grad} \end{bmatrix} \quad \text{(Eq. 20)}$$

In the light of the instant disclosure, the principles of the present invention can be extended by the ordinarily skilled artisan to situations wherein the reference magnetometer has any number (singular or plural) of vectorial magnetometers. For the vast majority of embodiments and applications, the present invention presupposes that the correction magnetometer is a triaxial magnetometer, in other words having three individual magnetometers directed along different axes. The inventors envision that, in all practicality, any gradiometer to be inventively aligned comprises: (i) a magnetometer having three vectorial axes, this triaxial magnetometer being inventively designated the "correction" (or "corrected") magnetometer; and, (ii) a magnetometer having at least one axis, i.e., any number of axes $\geq 1$, this single or plural axial magnetometer being inventively designated the "reference" magnetometer.

Hence, in accordance with this invention, the "triaxial" matrix formula set forth as Equation 20 hereinabove (wherein the correction magnetometer is always triaxial, and the word "triaxial" refers to the triaxial reference magnetometer) can be generalized to the "omniaxial" matrix formula set forth as Equation 21 hereinbelow (wherein the correction magnetometer is always triaxial, and the word "omniaxial" refers to the reference magnetometer having any whole number, i.e., $\geq 1$, of axes):

$$\begin{bmatrix} A_1 & B_1 & C_1 & D_1 \\ & \vdots & & \\ A_n & B_n & C_n & D_n \end{bmatrix} \begin{bmatrix} V_{x\_cor} \\ V_{y\_cor} \\ V_{z\_cor} \\ 1 \end{bmatrix} + \begin{bmatrix} V_{1\_ref} \\ \vdots \\ V_{n\_ref} \end{bmatrix} = \begin{bmatrix} I_{1\_grad} \\ \vdots \\ I_{n\_grad} \end{bmatrix} \quad \text{(Eq. 21)}$$

where n=a positive integer=number of reference magnetometer axes=number of magnetic gradients yielded by correlation of a reference magnetometer axis with a correction magnetometer axis.

In other words, n denotes the number of correlations of a reference magnetometer with a correction magnetometer, each such correlation yielding a magnetic gradient.

Looking at the inventive "omniaxial" relationships in another way, any of Equations 17 through 19 can be generalized as follows:

$$A_i(V_{x\_}{}^{cor})+B_i(V_{y\_}{}^{cor})+C_i(V_{z\_}{}^{cor})+D_i+V_{i\_}{}^{ref}=I_{i\_}{}^{grad}, \quad \text{(Eq 22)}$$

where i=a positive integer between 1 and n inclusive, wherein all the reference magnetometer axes (and hence all the correlations of a reference magnetometer axis with a correction magnetometer axis, and all the magnetic gradients which are yielded by such correlations) correspond serially to all positive integers between 1 and n inclusive.

The coefficients $A_i$, $B_i$, $C_i$ and $D_i$ have been found to change with temperature. The U.S. Navy conducted these tests in a non-magnetic oven which was placed in the center of a coil system located inside a building. The waterproof gradiometer housing flexed during temperature tests; therefore, in order to ensure that the triaxial magnetometers would not torque, the triaxial magnetometers were isolated from the case by mounting them on a titanium bar.

The oven comprised a wooden box which heated from room temperature to about 90° F. above ambient. The heating elements, non-magnetic light bulbs, were controlled by solid state relay which was "pulsed" by a U.S. Navy-designed thermostat printed circuit board (PCB). The heating elements were pulsed in such a way as to control the temperature hysteresis inside the oven to 0.2° F. The temperatures could be set either manually or via computer, using a digital-to-analog converter (D/A). In the hereindiscussed testing regarding temperature correction, the U.S. Navy used a computer to set the temperatures.

Inside each triaxial gradiometer was a temperature IC (LM34), the output of which was electrically changed to ±50 mV/° F. This sensitivity was chosen to give a ±10 V output across the full temperature range, because this is what the data-acquisition-system-CLDG-setup aboard the test-bed MCM used for input.

Reference now being made to FIG. 4a through FIG. 4d, FIG. 5a through FIG. 5d and FIG. 6a through FIG. 6d, these graphs illustrate coefficients versus temperature, i.e., how the coefficients were found to change in accordance with change in temperature. A gradiometer labeled "212" was used in these tests. The U.S. Navy used Microsoft Excel (a graph analysis program). The following nomenclature was used by the computer when computing coefficients in Microsoft Excel, and by the computer as the data was taken: XX COEF (or XX) denotes $A_x$; XY COEF (or XY) denotes $B_x$; XZ COEF (or XZ) denotes $C_x$; XOFF denotes $D_x$; YX COEF (or YX) denotes $A_y$; YY COEF (or YY) denotes $B_y$; YZ COEF (or YZ) denotes $C_y$; YOFF denotes $D_y$; ZX COEF (or ZX) denotes $A_z$; ZY COEF (or ZY) denotes $B_z$; ZZ COEF (or ZZ) denotes $C_z$; ZOFF denotes $D_z$.

The diamond points on the graphs shown in FIG. 4a through FIG. 6d are the actual data. In each graph, the solid line designated "_LS" is the least-squares fit derived from a built-in function of the data-acquisition program. The dotted line designated "_EX_LS" is the least-squares fit derived from Microsoft Excel; this was done to make sure that the "_LS" lines were predicted correctly, and the virtual coincidence in each graph of the "_EX_LS[1]" dotted line with the "_LS" solid line seems to indicate correctness of the least-square line-fit in each graph. If a fixed coefficient was desired rather than a line fit, the fixed coefficient was arbitrarily selected at 98° F., as represented by the dashed line designated "_CONST" for "constant."

Figures 4A, 4B, 4C, 4D:
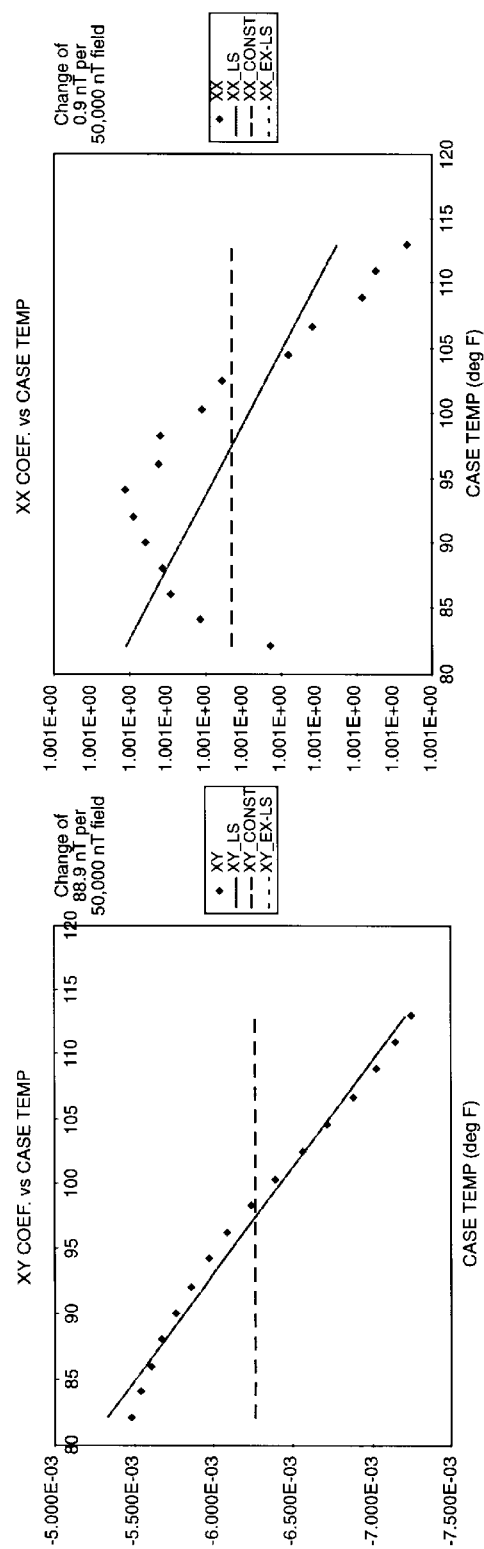
FIG. 4a through FIG. 4c are each a graphical representation of a correction coefficient of the X axis versus the temperature inside the gradiometer's case.
FIG. 4d is a graphical representation of the offset coefficient of the X axis versus the temperature inside the gradiometer's case.

FIG. 4a through FIG. 4d are four graphs showing the X axis coefficients versus the gradiometer's inside case temperature (° F.). FIG. 4a represents the $A_x$ correction coefficient versus the inside case temperature. FIG. 4b represents the $B_x$ correction coefficient versus the inside case temperature. FIG. 4c represents the $C_x$ correction coefficient versus the inside case temperature. FIG. 4d represents the $D_x$ offset coefficient versus the inside case temperature.

Figure 5A:
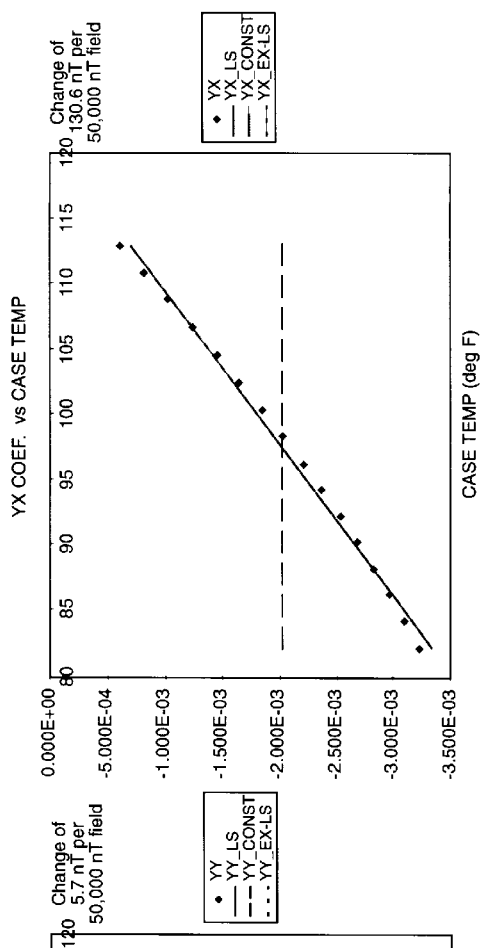
FIG. 5a through FIG. 5c are each a graphical representation of a correction coefficient of the Y axis versus the temperature inside the gradiometer's case.
Figure 5B:
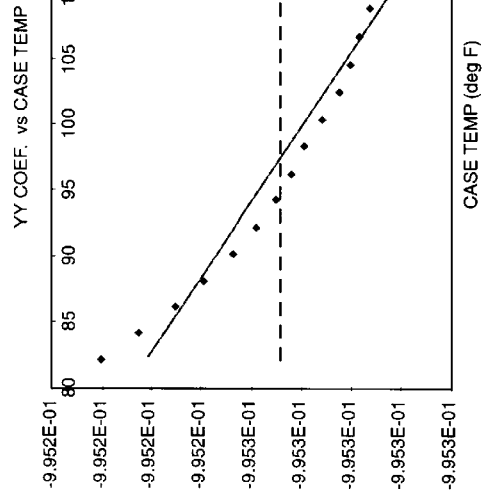
Figure 5C:
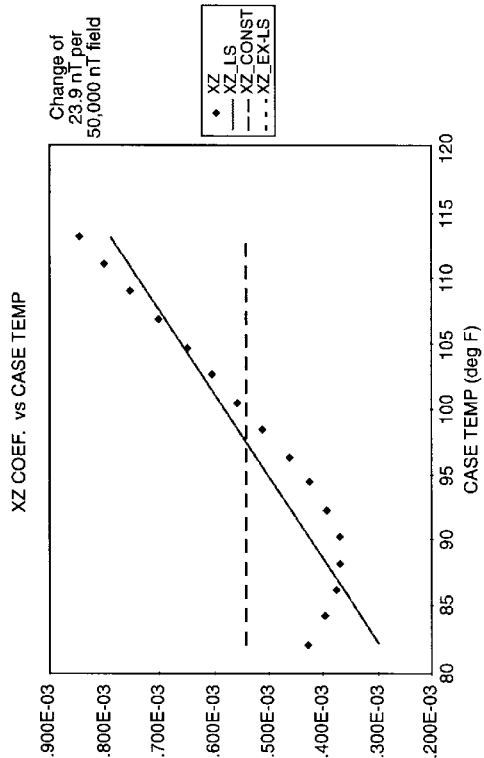
Figure 5D:
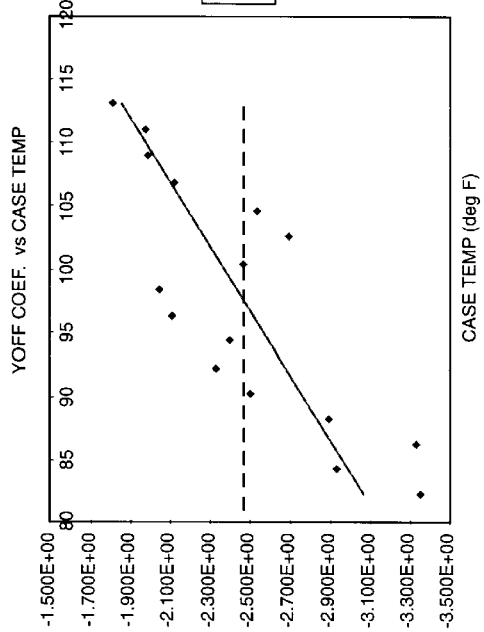
FIG. 5d is a graphical representation of the offset coefficient of the Y axis versus the temperature inside the gradiometer's case.

FIG. 5a through FIG. 5d are four graphs showing the Y axis coefficients versus the gradiometer's inside case temperature (° F.). FIG. 5a represents the $A_y$ correction coefficient versus the inside case temperature. FIG. 5b represents the $B_y$ correction coefficient versus the inside case temperature. FIG. 5c represents the $C_y$ correction coefficient versus the inside case temperature. FIG. 5d represents the $D_y$ offset coefficient versus the inside case temperature.

FIG. 6a through FIG. 6d are four graphs showing the z axis coefficients versus the gradiometer's inside case temperature (° F.). FIG. 6a represents the $A_z$ correction coefficient versus the inside case temperature. FIG. 6b represents the $B_z$ correction coefficient versus the inside case temperature. FIG. 6c represents the $C_z$ correction coefficient versus the inside case temperature. FIG. 6d represents the $D_z$ offset coefficient versus the inside case temperature.

The plot for each graph shown in FIG. 4a through FIG. 6d appears linear or substantially linear, with the exceptions of FIG. 4a and FIG. 5d. FIG. 4a and FIG. 5d are "scatter plots" which do not plainly manifest linearity. FIG. 4b, FIG. 4c, FIG. 4d, FIG. 5a, FIG. 5b, FIG. 5c, FIG. 6a, FIG. 6b, FIG. 6c and FIG. 6d represent good linear (straight line) fits.

The "line fit" for FIG. 4a undeniably looks terrible; however, the significance of this graph and its dubious "line fit" should be put in perspective. Since this is an X-coefficient (XX COEF) axis, a 50,000 nT field is applied along the X axis and 0 nT along the Y and Z axes. In theory, this means that all type y and type z magnetometers see very little of this X field, so the corresponding coefficients (XY COEF and XZ COEF) will be ignored. The case temperature was heated from 83° F. to 113° F. The min XX COEF was 1,0005767 at 113° F. and the max XX COEF was 1,0005953 at 94° F.; hence, taking the difference (max XX COEF)–(min XX COEF), the X gradient changed only 0.9 nT/ft between these two temperatures. Accordingly, it is basically concluded that the XX (i.e., $A_x$) coefficient did not require temperature correction, since this coefficient only changed 0.9 nT/ft/30° F. or 0.03 nT/ft/° F.

Like the XX COEF, the XZ COEF (i.e., $A_x$) shown in FIG. 4c did not change much in a 50,000 nT field (6.6 nT/ft). Even so, the XZ COEF is relatively linear; thus, it may be propitious for XZ to be temperature corrected for even a smaller X gradient error (vis-a-vis' XX) of <0.01 nT/ft/° F. The XOFF (i.e., $D_x$ offset coefficient) shown in FIG. 4d indicates a coefficient change of 12.9 nT/ft, which is obtained by taking the difference (max XOFF)–(min XOFF)=(40.67)–(27.77)=12.9.

The "line fit" for FIG. 5d is also questionable; however, similar as was the case for the XX (i.e., $A_x$) coefficient shown in FIG. 4a, the YOFF (i.e., $D_y$) offset coefficient shown in FIG. 5d exhibited a negligible rate of change, viz., 1.5 nT/ft/30° F. or 0.05 nT/ft/° F. Thus, the YOFF (i.e., $D_y$) offset coefficient did not require temperature correction.

FIG. 4b exemplifies how temperature correction can be significant. If a 50,000 nT field were applied along the Y axis and 0 nT along the X and Z axes, then the X gradient would change 88.9 nT/ft over the 30° F. tested temperature range. Without temperature correction, the XY COEF (i.e., $B_x$) would produce an X gradient change of 3 nT/° F. With temperature correction, this XY coefficient adds an error <0.02 nT/ft/° F. Similarly, temperature correction is recommended on the YX COEF (i.e., $A_y$), shown in FIG. 5d, since this coefficient changed 130.6 nT/ft/30° F. or 4.4 nT/ft/° F.

Figure 7A:
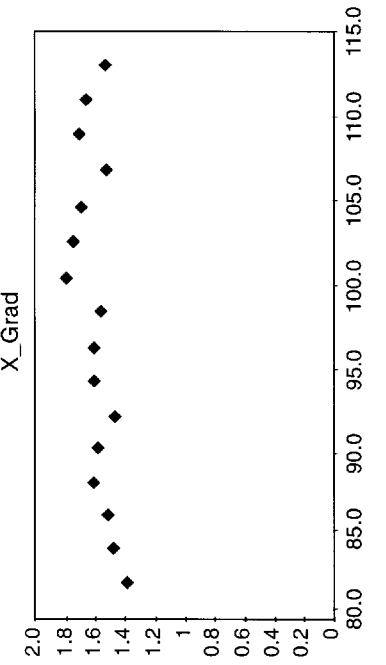
FIG. 7a through FIG. 7c are each a graphical representation of gradiometer alignment of the X axis versus the temperature inside the gradiometer's case, when the correction coefficients of the X axis are applied using temperature compensation.
Figure 7B:
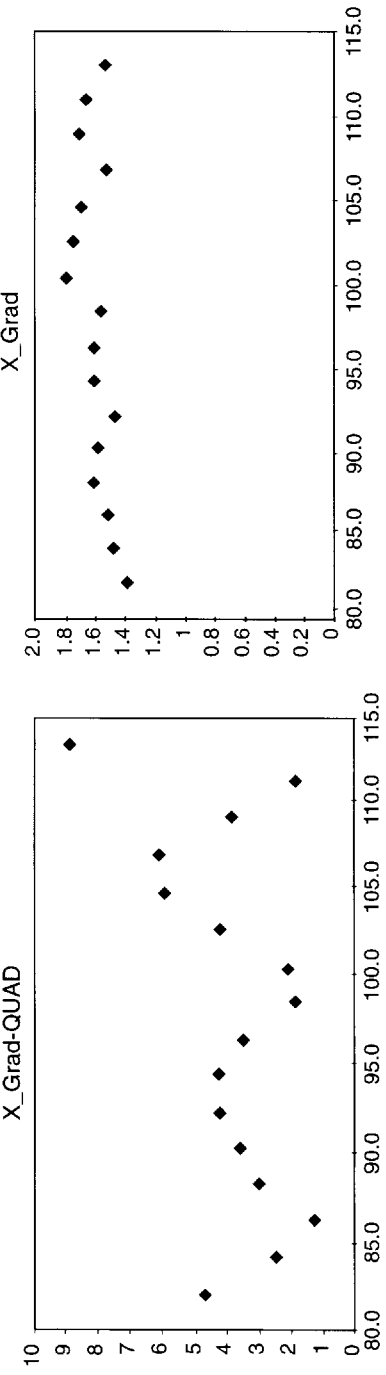
Figure 7C:
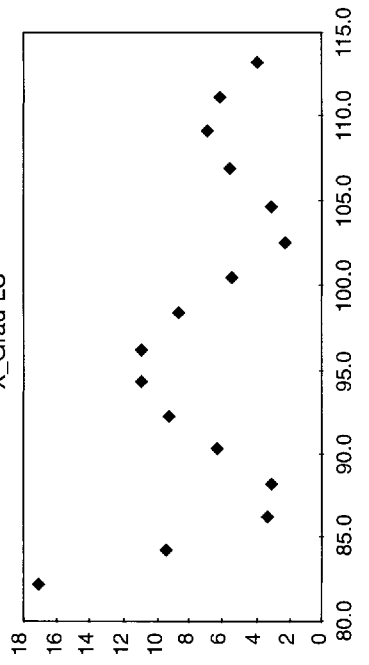
Figure 7D:
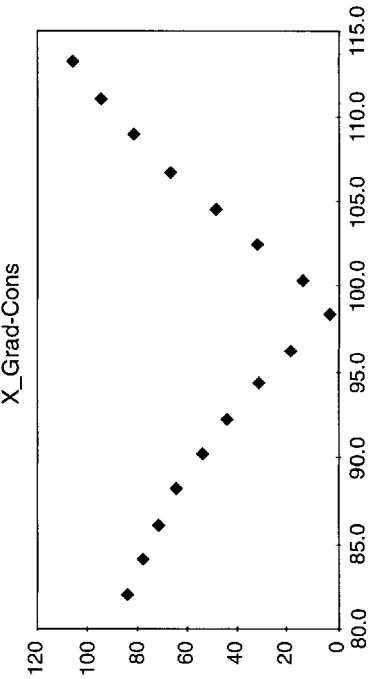
FIG. 7d is a graphical representation of gradiometer alignment of the X axis versus the temperature inside the gradiometer's case, when the correction coefficients of the X axis are applied in the absence of temperature compensation.

Reference now being made to FIG. 7a through FIG. 7d, FIG. 8a through FIG. 8d and FIG. 9a through FIG. 9d, these graphs illustrate alignment versus temperature, i.e., how the alignments were found to change in accordance with change in temperature. Again, the gradiometer labeled "212" was used in these tests. FIG. 7a through FIG. 7d are four graphs showing the X axis alignment (nT/ft) versus the gradiometer's inside case temperature (° F.). FIG. 7a ("X_Grad") represents this relationship when the X axis correction coefficients shown in FIG. 4a through FIG. 4d have been temperature-corrected by fitting to a look-up table. FIG. 7b ("X_Grad-QUAD") represents this relationship when these X axis correction coefficients have been temperature-corrected by fitting to a quadratic equation. FIG. 7c ("X_Grad-LS") represents this relationship when these X axis correction coefficients have been temperature-corrected by fitting to a straight line (i.e., linear equation). FIG. 7d ("X_Grad-Cons") represents this relationship when these X axis correction coefficients have not been temperature-corrected, i.e., are constant.

Figure 8B:
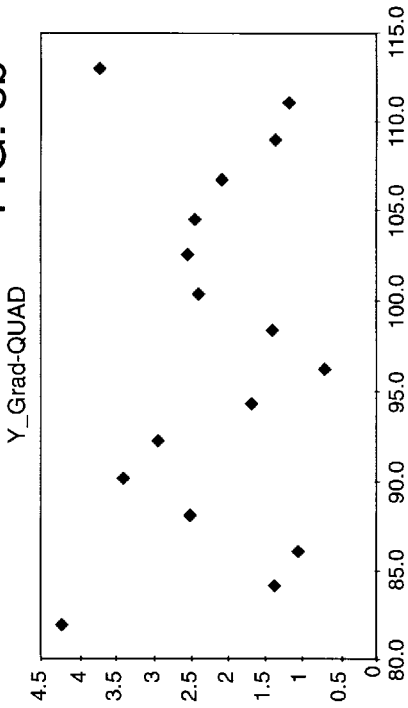
FIG. 8a through FIG. 8c are each a graphical representation of gradiometer alignment of the Y axis versus the temperature inside the gradiometer's case, when the correction coefficients of the Y axis are applied using temperature compensation.
Figure 8D:
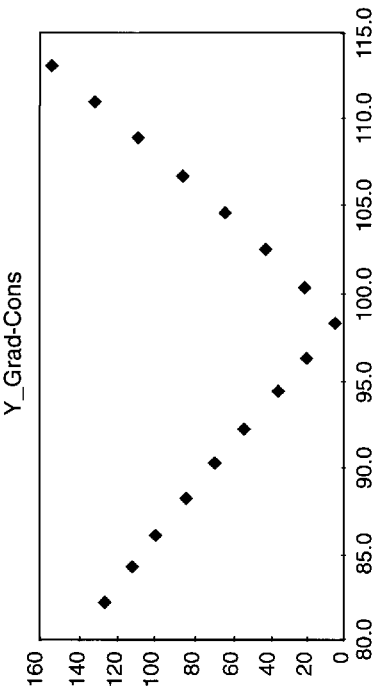
FIG. 8d is a graphical representation of gradiometer alignment of the Y axis versus the temperature inside the gradiometer's case, when the correction coefficients of the Y axis are applied in the absence of temperature compensation.
Figure 8A:
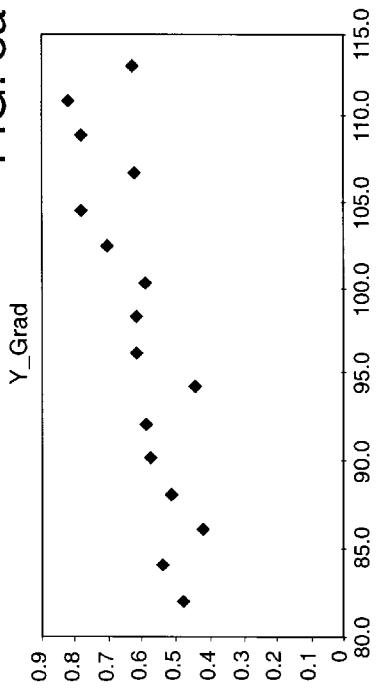
Figure 8C:
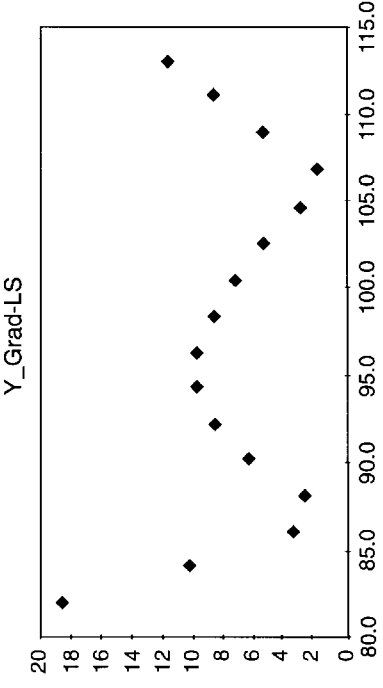

FIG. 8a through FIG. 8d are four graphs showing the Y axis alignment (nT/ft) versus the gradiometer's inside case temperature (° F.). FIG. 8a ("Y_Grad") represents this relationship when the Y axis correction coefficients shown in FIG. 5a through FIG. 5d have been temperature-corrected by fitting to a look-up table. FIG. 8b ("Y_Grad-QUAD") represents this relationship when these Y axis correction coefficients have been temperature-corrected by fitting to a quadratic equation. FIG. 8c ("Y_Grad-LS") represents this relationship when these Y axis correction coefficients have been temperature-corrected by fitting to a straight line (i.e., linear equation). FIG. 8d ("Y_Grad-Cons") represents this relationship when these Y axis correction coefficients have not been temperature-corrected, i.e., are constant.

Figure 9A:
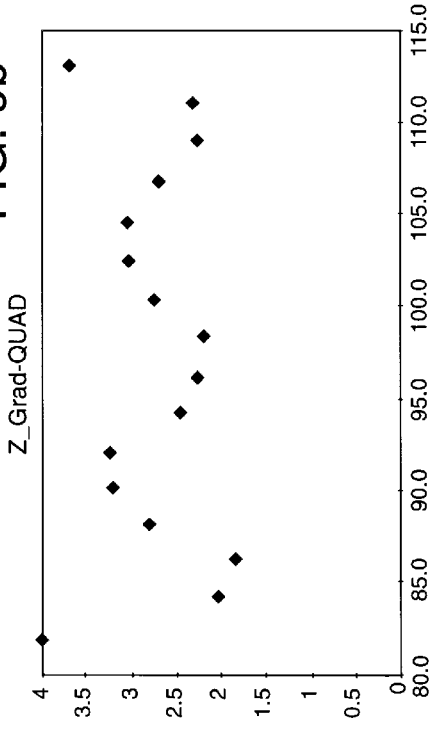
Figure 9C:
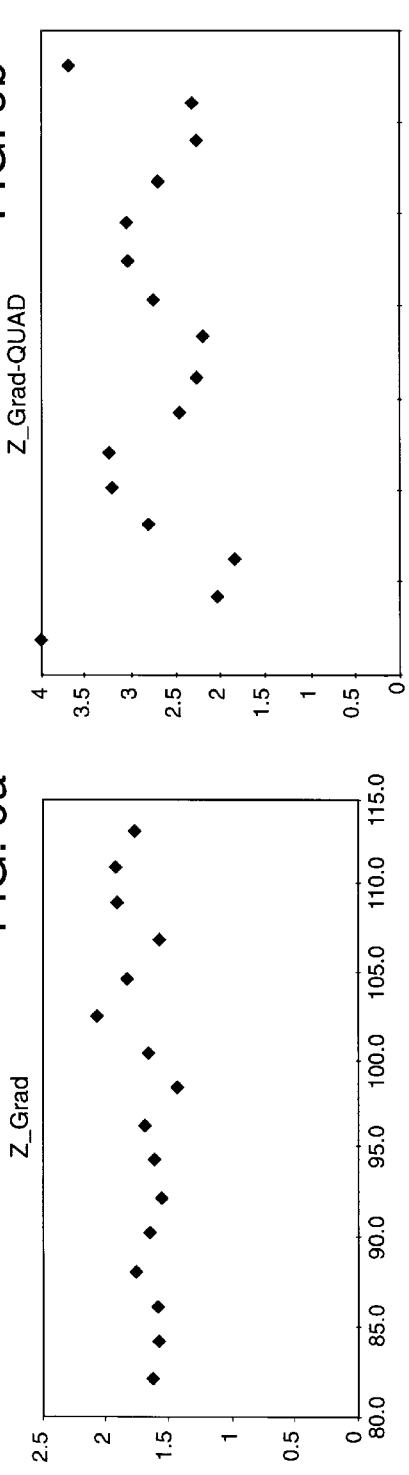

FIG. 9a through FIG. 9d are four graphs showing the Z axis alignment (nT/ft) versus the gradiometer's inside case temperature (° F). FIG. 9a ("Z_Grad") represents this relationship when the Z axis correction coefficients shown in FIG. 6a through FIG. 6d have been temperature-corrected by fitting to a look-up table. FIG. 9b ("Z_Grad-QUAD") represents this relationship when these Z axis correction coefficients have been temperature-corrected by fitting to a quadratic equation. FIG. 9c ("Z_Grad-LS") represents this relationship when these Z axis correction coefficients have been as temperature-corrected by fitting to a straight line (i.e., linear equation). FIG. 9d ("Z_Grad-Cons") represents this relationship when these Z axis correction coefficients have not been temperature-corrected, i.e., are constant.

Referring to FIG. 7a through FIG. 7d, for example, FIG. 7a ("X_Grad") reveals an alignment variation from 1.4 nT/ft to 1.8 nT/ft over the whole 30° F., or a change of 0.4 nT/ft/30° F.=0.012 nT/ft/° F. A disadvantage of this approach is that look-up tables slow a computer's task, especially when the computer has to interpolate. FIG. 7b ("X_Grad-QUAD") reveals a temperature alignment to <0.3 nT/ft/° F. FIG. 7c ("X_Grad-LS") reveals a temperature alignment to <0.5 nT/ft/° F. In FIG. 7d, "X_Grad-Cons" is a constant; the practitioner picks one set of coefficients from FIG. 4a through FIG. 4d and the temperature alignment becomes <0.4nT/ft/° F.

FIG. 7a through FIG. 7d, FIG. 8a through FIG. 8d and FIG. 9a through FIG. 9d also serve to illustrate how the principles of the present invention can be used to facilely ascertain the degree of error which is intrinsic to gradiometer apparatus, or which is intrinsic to magnetometer apparatus which is included thereby. Accordingly, the present invention provides method and system for determining the intrinsic error of a gradiometer and/or of a magnetometer which is a component of a gradiometer.

Each figure (FIG. 7a through FIG. 9d) depicts a plot of data points; each data point is indicative of misalignment at a selected temperature, and is determined as follows: (i) Compute the alignment (correction and offset) coefficients; (ii) applying the computed alignment coefficients to Equation 21, calculate the gradient for each of the relative orientations which were effectuated for computing these alignment coefficients; (iii) find the maximum calculated gradient and the minimum calculated gradient; (iv) subtract the minimum calculated gradient from the maximum calculated gradient.

The minimum value on each plot among FIG. 7a through FIG. 9d represents the intrinsic error of the sensor axis. The intrinsic error can be approximated by using any of the calculated gradient values, for instance when using a look-up table to compute the alignment coefficients. Accordingly, an acceptable approximation of the intrinsic error can be ascertained by determining alignment coefficients and gradients at a single (e.g., room) temperature.

The inventive practitioner can thus adopt an intrinsic error threshold for apparatus which the practitioner would consider using for a particular application. By inventively testing the apparatus, the practitioner can decide, in "zero-sum" fashion, whether or not that apparatus passes muster for that application.

The inventive practitioner who is of ordinary skill in the art is, upon having read this disclosure, thoroughly capable of selecting the appropriate technique or techniques for applying correction coefficients. Factors to be considered with regard to this selection of coefficients method(s) include the following: (i) computer speed versus number of sensors to monitor; (ii) how much temperature alignment mismatch can be tolerated; (iii) complex computer program versus simple computer program; (iv) outside the tested temperature range, the quadratic fit may produce large errors.

The results illustrated in FIG. 7a through FIG. 7d, FIG. 8a through FIG. 8d and FIG. 9a through FIG. 9d indicate a significant advantage of inventive electrical/software alignment vis-a-vis' conventional mechanical alignment.

TABLE 1, below, comparatively summarizes the errors displayed in FIG. 7a through FIG. 7d, FIG. 8a through FIG. 8d and FIG. 9a through FIG. 9d.

TABLE 1

TEMPERATURE VERSUS COEFFICIENTS METHODS; ALIGNMENT DEVIATIONS OVER TEMPERATURE

|  | Table Look Up | Quadratic Fit | Line Fit | Constant |
| --- | --- | --- | --- | --- |
| X Grad Axis | 0.013 nT/ft/° F. | 0.3 nT/ft/° F. | 0.5 nT/ft/° F. | 3.7 nT/ft/° F. |
| Y Grad Axis | 0.013 nT/ft/° F. | 0.13 nT/ft/° F. | 0.47 nT/ft/° F. | 5.2 nT/ft/° F. |
| Z Grad Axis | 0.02 nT/ft/° F. | 0.077 nT/ft/° F. | 0.47 nT/ft/° F. | 2.5 nT/ft/° F. |

TABLE 2, below, compares the results obtained via outside rotation versus the results obtained via building field rotation. The U.S. Navy used a first prototype unit (not sensor marked "212") for these tests.

TABLE 2

ROTATING SENSOR VERSUS ROTATING FIELDS
ALONG ALL AXES OF TRIAXIAL GRADIOMETER
(ALIGNMENT ERROR (NT/FT) IS DISPLAYED)

|  | OUTSIDE COEF VS OUTSIDE DATA | INSIDE COEF VS INSIDE DATA | OUTSIDE COEF VS INSIDE DATA | INSIDE COEF VS OUTSIDE DATA |
|---|---|---|---|---|
| X Gradiometer Error | 5.9 | 3.0 | 20.0 | 11.5 |
| Y Gradiometer Error | 6.8 | 0.7 | 48.7 | 45.0 |
| Z Gradiometer Error | 14.0 | 2.5 | 18.7 | 18.6 |

"Curve-fitting" is a mathematical term which describes the representation of a set of experimental data by means of a mathematical equation. See, e.g., *Van Nostrand's Scientific Encyclopedia*, Fifth Edition, New York, 1976, page 728 (esp., "curve fitting"). Sometimes a theoretical relation between the experimental variables is not known or is unwieldy, and a purely empirical equation is desired to be assumed. In other words, it is desired to represent data by an equation y=f(x). There are two aspects to this task, namely, (a) to select an appropriate form for the equation, and (b) to evaluate the constants in it.

The first step is generally graphical, wherein y is plotted against x. If, for instance, a straight line ensues, the equation may be expressed in the form y=mx+b. If, for example, the data fit an equation of the form $y=ax^n$, a plot of log x versus n(log y) would be a straight line of slope n for log y=log a+log x. When no such transformation reduces the equation to first degree (linear) form, a polynomial (of second degree or higher) should be tried. For instance, the equation can be a quadratic (second degree) equation of the form $y=ax^2+bx+c$.

The next step involves numerical evaluation of the constants in the equation which has been selected. Such evaluation can be performed: graphically; by the methods of selected points, choosing as many $(x_i, y_i)$ pairs as there are unknown constants and solving the resulting simultaneous equations for the constants; by the method of averages, grouping all of the $(x_i, y_i)$ pairs into a number of sets equal to the number of unknowns, taking their averages, and again solving simultaneous equations; by the method of least-squares. Generally speaking, closeness of fit between observed and calculated points, as well as the work involved in computation, increase in order from the graphical evaluative approach to the least-squares evaluative approach.

Other embodiments of this invention will be apparent to those skilled in the art from a consideration of this specification or practice of the invention disclosed herein. Various omissions, modifications and changes to the principles described may be made by one skilled in the art without departing from the true scope and spirit of the invention which is indicated by the following claims.

What is claimed is:

1. A method for aligning a magnetic gradiometer having two magnetometers, said method comprising:

designating a correction said magnetometer having at least three correction vectors j_cor, each said correction vector corresponding to one of the X, Y and Z axes, respectively, whereby said X, Y and Z axes are theoretically orthogonal, wherein j denotes a positive integer between 1 and m inclusive, wherein all said correction vectors correspond serially to all positive integers between 1 and m inclusive;

designating a reference said magnetometer having at least one reference vector i_ref, each said reference vector i_ref corresponding to one of said X, Y and Z axes, wherein i denotes a positive integer between 1 and n inclusive, wherein all said reference vectors correspond serially to all positive integers between 1 and n inclusive;

for at least one said reference vector i_ref, correlating said reference vector with a said correction vector j_cor which corresponds to the same said axis, said correlating including evaluating correction coefficients $K1_i, K2_i, \ldots Km_i$ and offset coefficient $K(m+1)_i$, said evaluating including:

at least four times, relatively orienting a magnetic field with respect to said magnetic gradiometer;

for each said relative orientation, measuring a voltage output $V_{j\_}^{cor}$ for each said j_cor, and a voltage output $V_{i\_}^{ref}$ for i_ref; and with respect to said at least four times, approximating $K1_i, K2_i, K3_i \ldots K(m+1)_i$ in the equation $K1_i(V_{1\_}^{cor}) + K2_i(V_{2\_}^{cor}) + \ldots + Km_i(V_{m\_}^{cor}) + K(m+1)_i + V_{i\_}^{ref} = I_{i\_}^{grad} = 0$, wherein $V_{j\_}^{cor}$ is said measured voltage output $V_{j\_}^{cor}$, wherein $V_{i\_}^{ref}$ is said measured voltage output $V_{i\_}^{ref}$, wherein $I_{i\_}^{grad}$ is the magnetic gradient for said correlation, wherein j denotes a positive integer between 1 and m inclusive, wherein i denotes a positive integer between 1 and n inclusive, wherein all said magnetic gradients correspond serially to all positive integers between 1 and n inclusive.

2. A method for aligning a magnetic gradiometer as in claim 1, wherein said relative orienting includes moving said magnetic gradiometer in a uniform magnetic field.

3. A method for aligning a magnetic gradiometer as in claim 1, wherein said relative orienting includes directionally changing said magnetic field.

4. A method for aligning a magnetic gradiometer as in claim 1, wherein said correlating includes:

performing said evaluating at each of a plurality of temperatures; and establishing a variation of correction coefficients $K1_i$, $K2_i, \ldots Km_i$, and offset coefficient $K(m+1)_i$ in accordance with temperature.

5. A method for aligning a magnetic gradiometer having two magnetometers, said method comprising:

designating a correction said magnetometer having three correction vectors x_cor, y_cor and z_cor, said three correction vectors corresponding to the X, Y and Z axes, respectively, whereby said X, Y and Z axes are theoretically orthogonal;

designating a reference said magnetometer having at least one reference vector i_ref, each said reference vector i_ref corresponding to one of said X, Y and Z axes, wherein i denotes a positive integer between 1 and n inclusive, wherein all said reference vectors correspond serially to all positive integers between 1 and n inclusive;

for at least one said reference vector i_ref, correlating said reference vector with said correction vector which corresponds to the same said axis, said correlating including evaluating correction coefficients $A_i$, $B_i$ and $C_i$ and offset coefficient $D_i$, said evaluating including:

at least four times, relatively orienting a magnetic field with respect to said magnetic gradiometer;

for each said relative orientation, measuring a voltage output $V_{x\_}^{cor}$ for x_cor, a voltage output $V_{y\_}^{cor}$ for y_cor, a voltage output $V_{z\_}^{cor}$ for z_cor, and a voltage output $V_{i\_}^{ref}$ for i_ref; and with respect to said at least four times, approximating $A_i$, $B_i$, $C_i$ and $D_i$ in the equation $A_i(V_{x\_}^{cor})+B_i(V_{y\_}^{cor})+C_i(V_{z\_}^{cor})+D_i+V_{i\_}^{ref}=I_{i\_}^{grad}=0$, wherein $V_{x\_}^{cor}$ is said measured voltage output $V_{x\_}^{cor}$, wherein $V_{y\_}^{cor}$ is said measured voltage output $V_{y\_}^{cor}$, wherein $V_{z\_}^{cor}$ is said measured voltage output $V_{z\_}^{cor}$, wherein $V_{i\_}^{ref}$ is said measured voltage output $V_{i\_}^{ref}$, wherein $I_{i\_}^{grad}$ is the magnetic gradient for said correlation, wherein i denotes a positive integer between 1 and n inclusive, wherein all said magnetic gradients correspond serially to all positive integers between 1 and n inclusive.

6. A method for aligning a magnetic gradiometer as in claim 5, wherein said relative orienting includes moving said magnetic gradiometer in a uniform magnetic field.

7. A method for aligning a magnetic gradiometer as in claim 5, wherein said relative orienting includes directionally changing said magnetic field.

8. A method for aligning a magnetic gradiometer as in claim 5, wherein said relative orienting includes relatively orienting at least six times.

9. A method for aligning a magnetic gradiometer as in claim 8, wherein said relative orienting includes relatively orienting approximately in the positive and negative directions of each of said X, Y and Z axes.

10. A method for aligning a magnetic gradiometer as in claim 8, wherein said relative orienting includes spherically rotating said magnetic gradiometer.

11. A method for aligning a magnetic gradiometer as in claim 8, wherein said relative orienting includes spherically rotating said magnetic field.

12. A method for aligning a magnetic gradiometer as in claim 5, wherein said approximating includes least-squares.

13. A method for aligning a magnetic gradiometer as in claim 5, wherein said correlating includes:
    performing said evaluating at each of a plurality of temperatures; and
    establishing a variation of $A_i$, $B_i$, $C_i$ and $D_i$ in accordance with temperature.

14. A method for aligning a magnetic gradiometer as in claim 13, wherein said relative orienting includes placing said magnetic gradiometer in an oven and spherically rotating said magnetic field.

15. A method for aligning a magnetic gradiometer as in claim 13, wherein said establishing a variation includes formulating a look-up table.

16. A method for aligning a magnetic gradiometer as in claim 13, wherein said establishing a variation includes curve-fitting to an equation y=f(x) of a form selected from the group consisting of:
    a linear equation of the form y=mx+b; and
    a quadratic equation of the form $y=ax^2+bx+c$.

17. A method for aligning a magnetic gradiometer as in claim 5, wherein said reference said magnetometer has one said reference vector i_ref which is selected from the group consisting of x_ref corresponding to said X axis, y_ref corresponding to said Y axis, and z_ref corresponding to said Z axis.

18. A method for aligning a magnetic gradiometer as in claim 5, wherein:
    said reference said magnetometer has three said reference vectors which are x_ref corresponding to said X axis, y_ref corresponding to said Y axis, and z_ref corresponding to said Z axis; and
    said correlating includes correlating x_ref with x_cor, correlating y_ref with y_cor, and correlating z_ref with z_cor.

* * * * *